(12) United States Patent
Ichikawa

(10) Patent No.: US 12,471,440 B2
(45) Date of Patent: Nov. 11, 2025

(54) DISPLAY DEVICE, METHOD FOR FABRICATING DISPLAY DEVICE, AND ELECTRONIC INSTRUMENT

(71) Applicant: Sony Semiconductor Solutions Corporation, Kanagawa (JP)

(72) Inventor: Tomoyoshi Ichikawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 501 days.

(21) Appl. No.: 17/996,551

(22) PCT Filed: Apr. 27, 2021

(86) PCT No.: PCT/JP2021/016810
§ 371 (c)(1),
(2) Date: Oct. 19, 2022

(87) PCT Pub. No.: WO2021/225096
PCT Pub. Date: Nov. 11, 2021

(65) Prior Publication Data
US 2023/0217737 A1    Jul. 6, 2023

(30) Foreign Application Priority Data

May 7, 2020  (JP) ................................ 2020-081724

(51) Int. Cl.
*H10K 50/852*    (2023.01)
*H10K 59/12*    (2023.01)
(Continued)

(52) U.S. Cl.
CPC .......... *H10K 50/852* (2023.02); *H10K 59/12* (2023.02); *H10K 59/1201* (2023.02);
(Continued)

(58) Field of Classification Search
CPC ............ H10K 50/852; H10K 59/1275; H10K 59/131; H10K 59/1201; H10K 59/879; H10K 59/35; H10K 59/876; H10K 59/12
See application file for complete search history.

(56) References Cited

U.S. PATENT DOCUMENTS

| 2012/0119237 A1* | 5/2012 | Leatherdale | H10H 29/142 |
| | | | 257/E33.006 |
| 2016/0021718 A1* | 1/2016 | Kikuchi | H10K 59/8791 |
| | | | 445/24 |

(Continued)

FOREIGN PATENT DOCUMENTS

| JP | 2002072907 A | 3/2002 |
| JP | 2006201421 A | 8/2006 |
| JP | 2010034030 A | 2/2010 |

OTHER PUBLICATIONS

International Search Report (PCT/ISA/210), International Application No. PCT/JP2021/016810, dated Jun. 15, 2021.

*Primary Examiner* — Michael Jung
(74) *Attorney, Agent, or Firm* — Michael Best & Friedrich LLP

(57) ABSTRACT

A display device is formed such that pixels that each include a light emitting element formed by stacking an upper electrode, a light emitting unit, and a lower electrode are arranged in a two-dimensional matrix. The light emitting elements are formed by forming the upper electrodes which are light-transmissive, and then sequentially stacking, onto the upper electrodes, the light emitting units and the lower electrode which is formed from a metal material.

20 Claims, 44 Drawing Sheets

(51) Int. Cl.
*H10K 59/127* (2023.01)
*H10K 59/131* (2023.01)
*H10K 59/35* (2023.01)
*H10K 59/80* (2023.01)

(52) U.S. Cl.
CPC ....... *H10K 59/1275* (2023.02); *H10K 59/131* (2023.02); *H10K 59/35* (2023.02); *H10K 59/876* (2023.02); *H10K 59/879* (2023.02)

(56) References Cited

U.S. PATENT DOCUMENTS

2020/0212022 A1* 7/2020 Ahmed ............... H10H 20/821
2021/0111196 A1* 4/2021 Yamazaki .......... H10D 30/6734

* cited by examiner

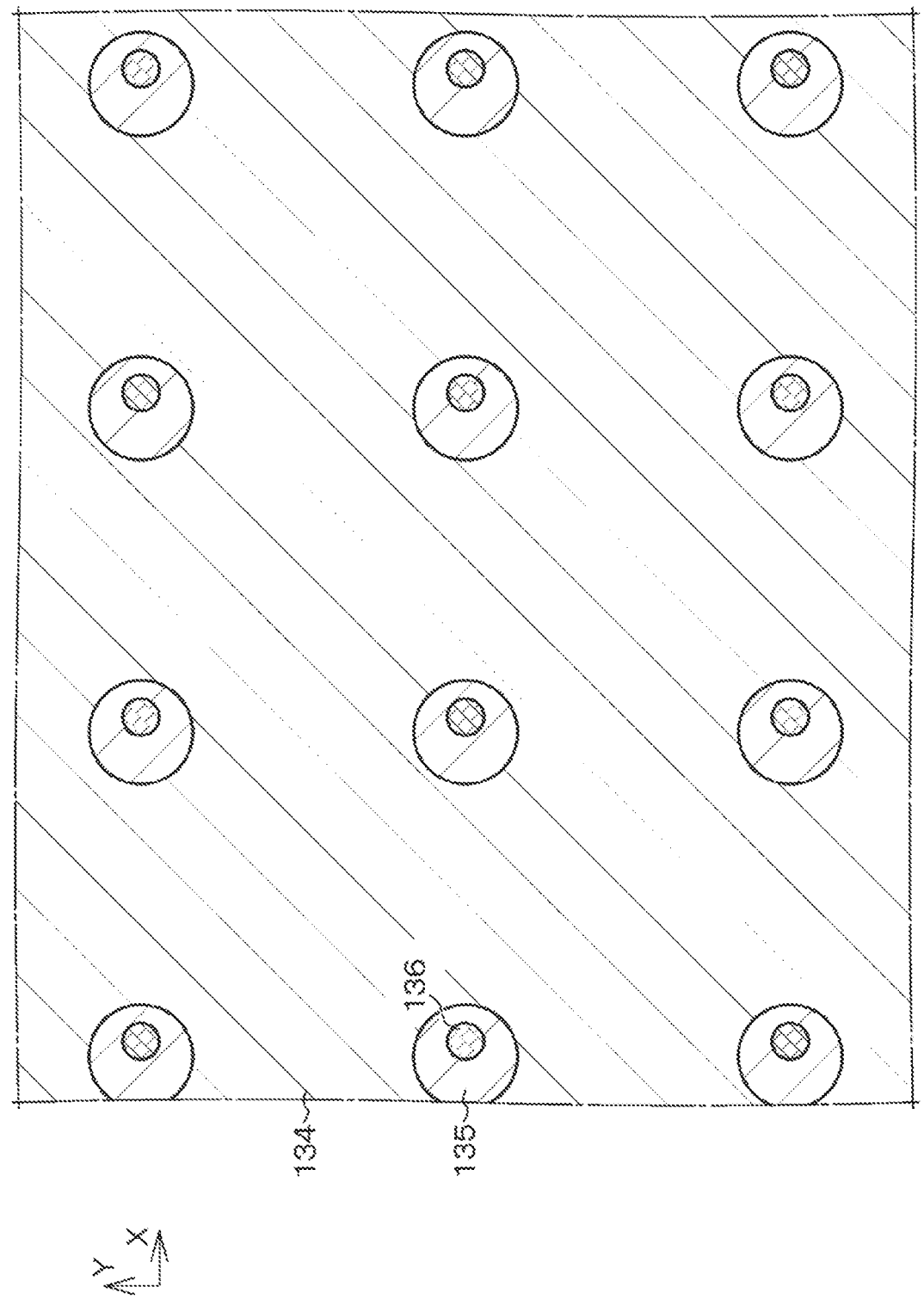

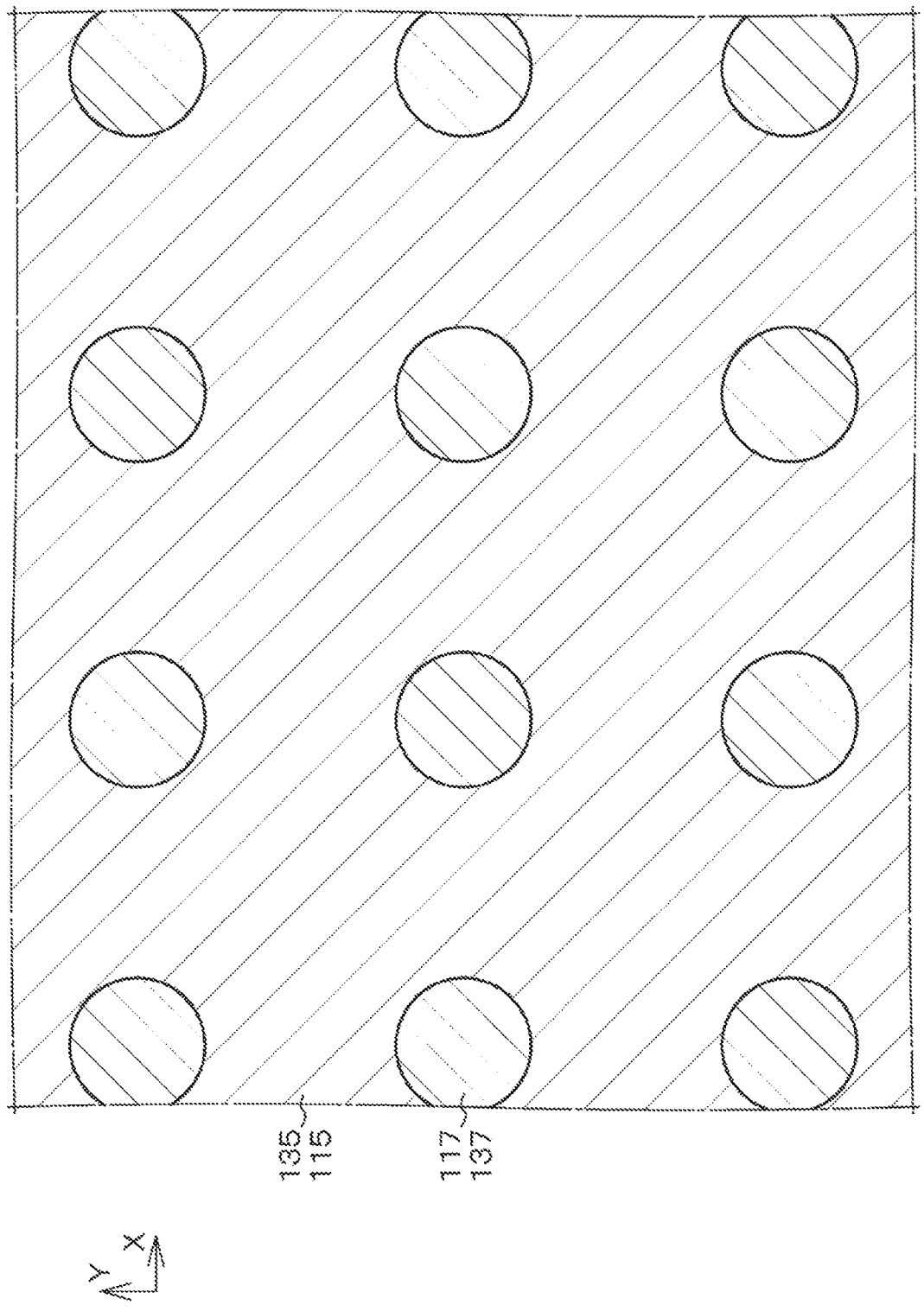

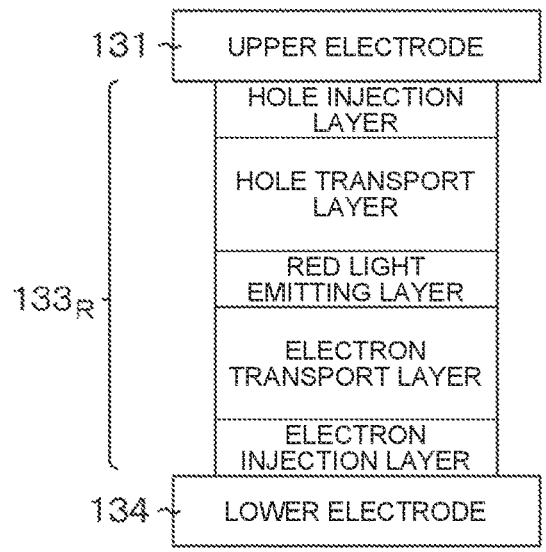
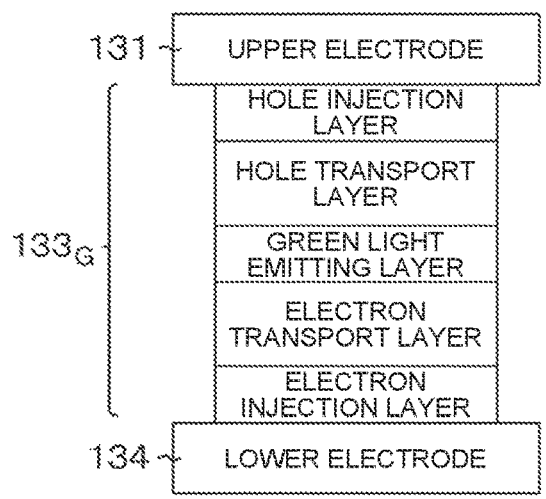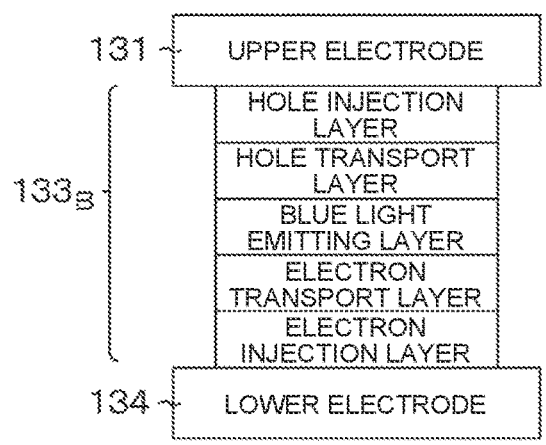

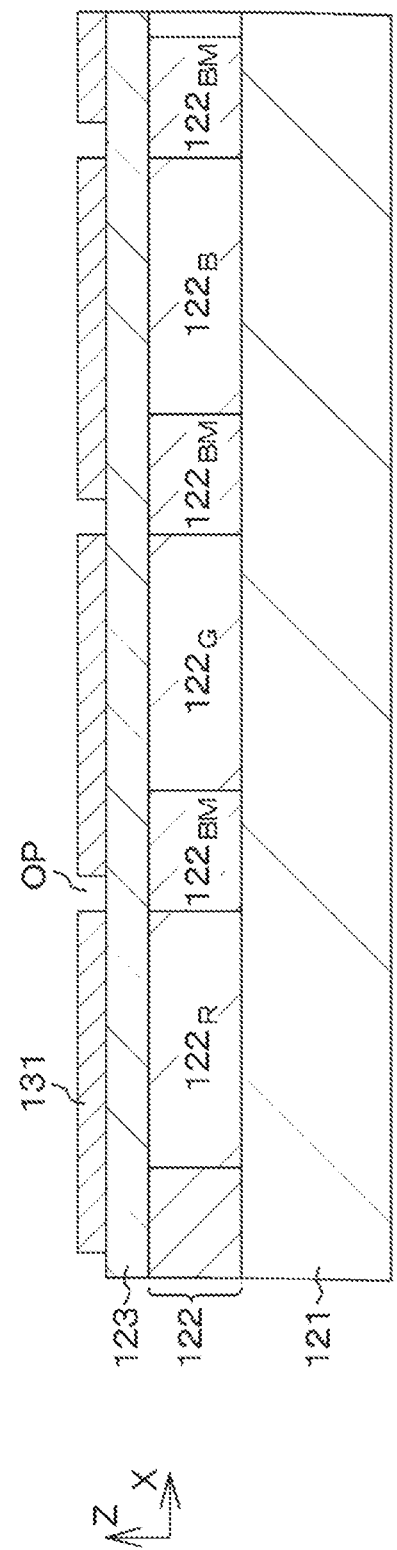

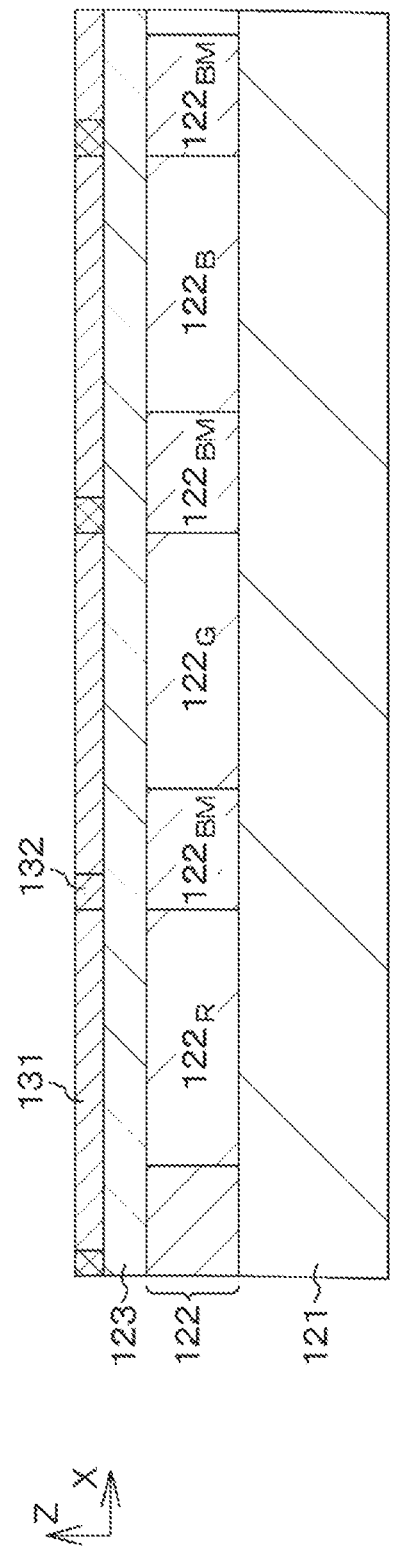

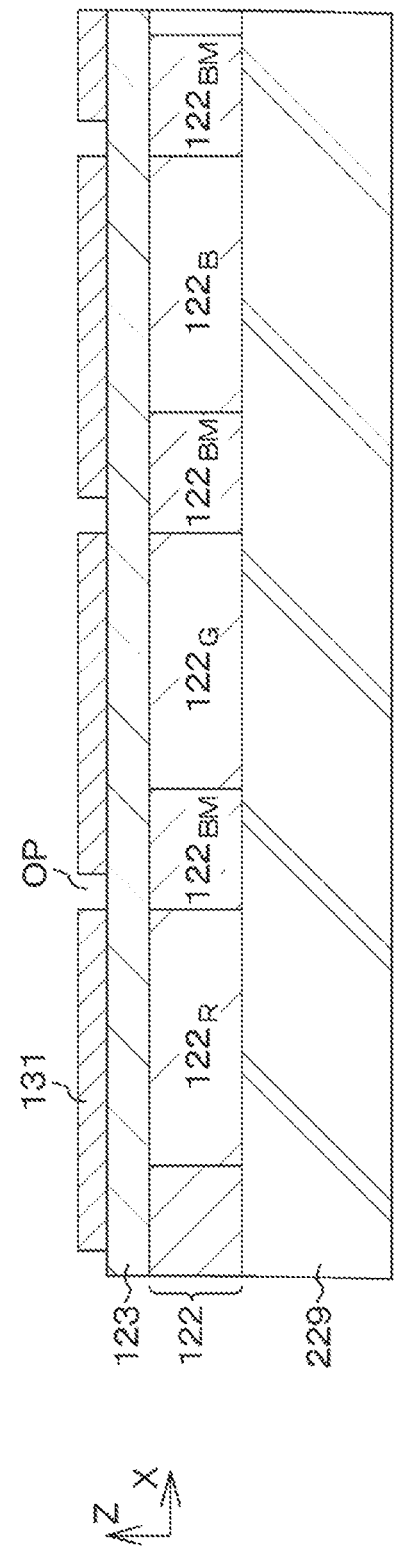

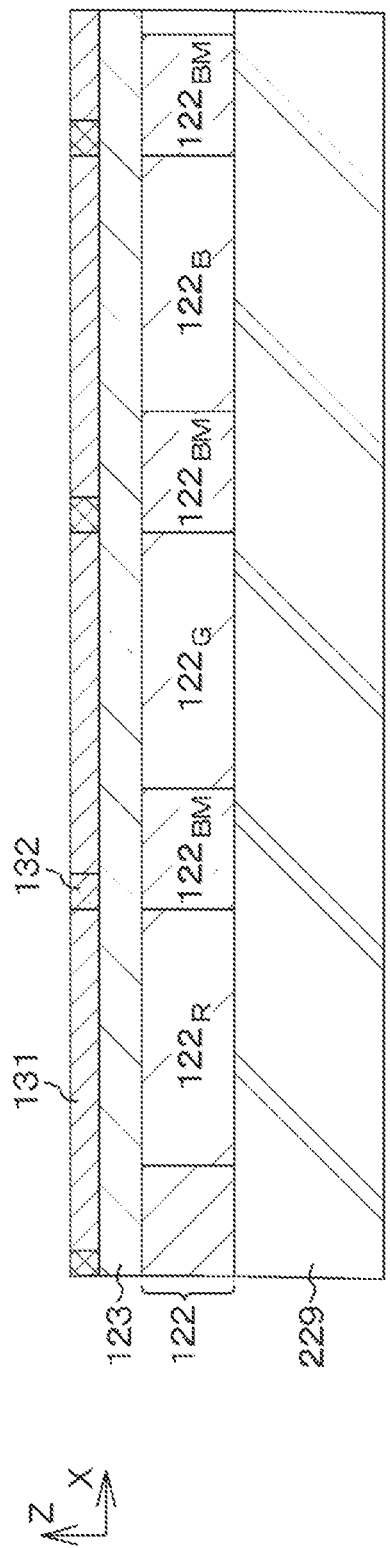

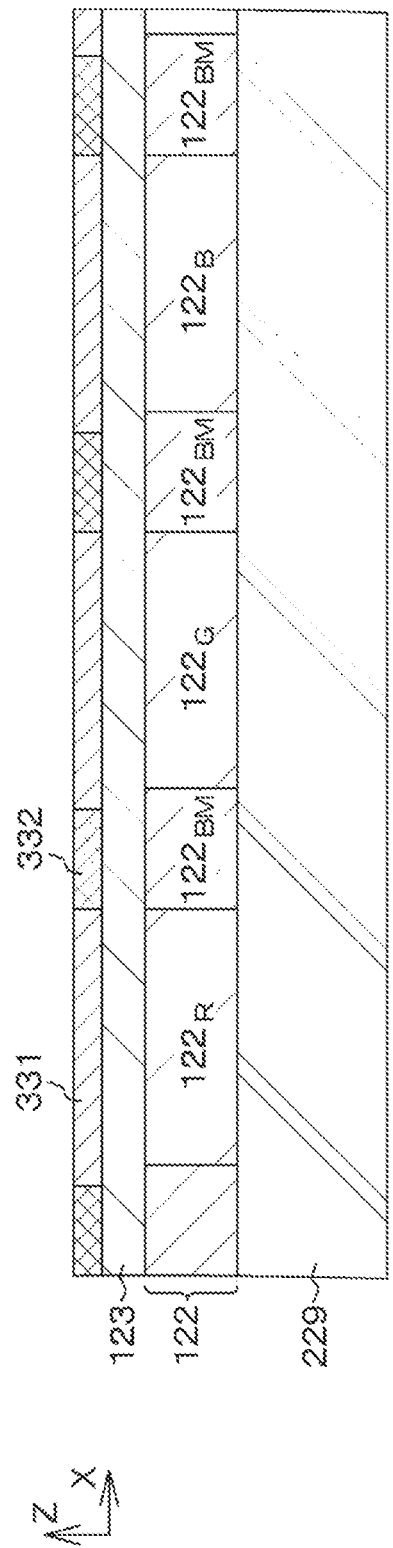

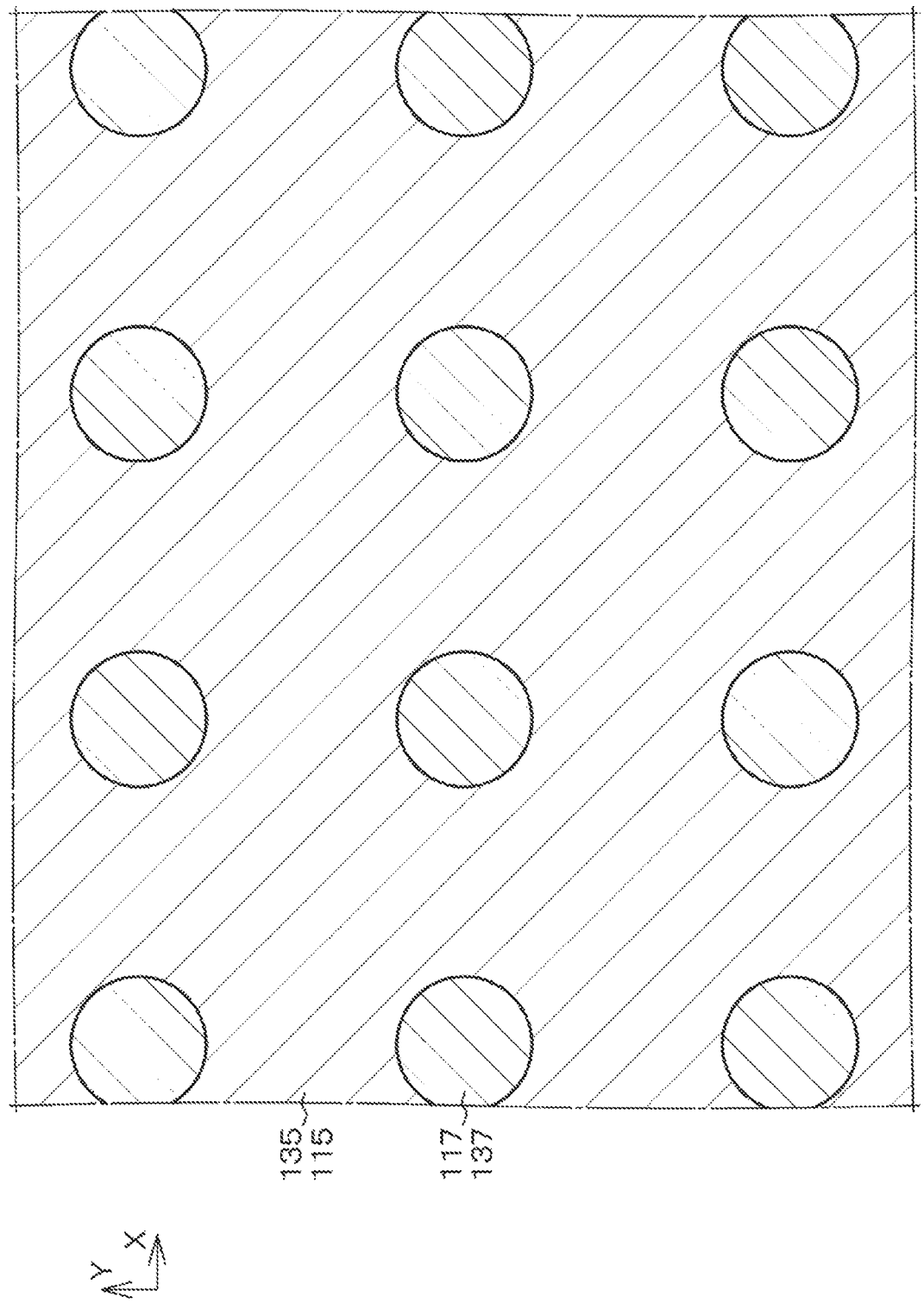

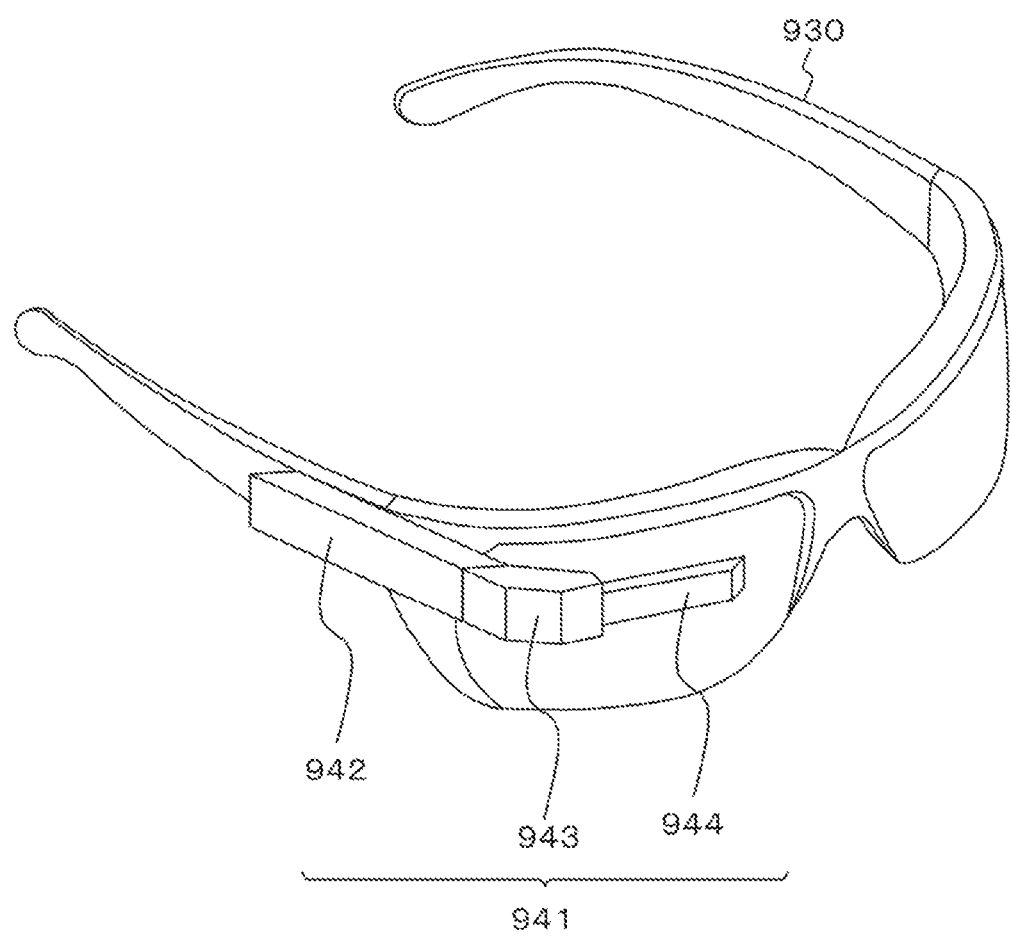

DISPLAY DEVICE, METHOD FOR FABRICATING DISPLAY DEVICE, AND ELECTRONIC INSTRUMENT

FIELD

The present disclosure relates to a display device, a method for fabricating the display device, and an electronic instrument.

BACKGROUND

In recent years, display devices using electro luminescence (EL) of an organic material have attracted attention as display devices that can replace liquid crystal display devices. Display devices using organic EL have also started to tend to be applied to direct-view displays such as monitors, as well as to ultra-small displays requiring a fine pixel pitch of about several microns.

Many display devices and the like for ultra-small display applications have, for example, a structure in which light emitting units including light emitting layers are formed, and light-transmissive upper electrodes are formed on the light emitting units, such that light from the light emitting units is received on the upper-electrode side (see, for example, Patent Literature 1). The light-transmissive upper electrodes are typically formed using, for example, a sputtering method.

CITATION LIST

Patent Literature

Patent Literature 1: JP 2006-201421 A

SUMMARY

Technical Problem

Forming a light emitting unit and then forming an upper electrode on the light emitting unit by using, for example, a sputtering method will lead to damaging the light emitting unit due to sputtering. If the light emitting unit is damaged, the voltage required for causing the light emitting unit to emit light will be increased, thereby providing a cause of hindering increasing the luminance of the display device.

Accordingly, an object of the present disclosure is to provide a display device including light emitting units that are not damaged by forming light-transmissive upper electrodes, an electronic instrument including the display device, and a method for fabricating the display device.

Solution to Problem

In order to the achieve the object, a display device according to the present disclosure, wherein pixels each including a light emitting element formed by stacking an upper electrode, a light emitting unit, and a lower electrode are arranged in a two-dimensional matrix, and the light emitting elements are formed by forming the upper electrodes which are light-transmissive, and then sequentially stacking, onto the upper electrodes, the light emitting units and the lower electrode which is formed from a metal material.

In order to the achieve the object, a method according to the present disclosure a method for fabricating a display device in which pixels each including a light emitting element formed by stacking an upper electrode, a light emitting unit, and a lower electrode are arranged in a two-dimensional matrix, the method comprising: a step of forming the light emitting elements by forming, on a base material, the upper electrodes which are light-transmissive, and then sequentially stacking, onto the upper electrodes, the light emitting units and the lower electrode which is formed from a metal material.

In order to the achieve the object, an electronic instrument according to the present disclosure includes: a display device, wherein pixels each including a light emitting element formed by stacking an upper electrode, a light emitting unit, and a lower electrode are arranged in a two-dimensional matrix, and the light emitting elements are formed by forming the upper electrodes which are light-transmissive, and then sequentially stacking, onto the upper electrodes, the light emitting units and the lower electrode which is formed from a metal material.

BRIEF DESCRIPTION OF DRAWINGS

FIG. 5 is a schematic cross-sectional view of a portion indicated by B-B in FIG. 3.

FIG. 6 is a schematic cross-sectional view of a portion indicated by C-C in FIG. 3.

FIG. 8A, which follows

FIG. 8B, which follows

FIG. 8C, which follows

FIG. 10A, which follows

FIG. 10B, which follows

FIG. 10B, is a schematic partial cross-sectional view of the base material and other elements for illustrating the method for fabricating the display device according to the first embodiment.

FIG. 11, is a schematic partial cross-sectional view of the base material and other elements for illustrating the method for fabricating the display device according to the first embodiment.

FIG. 12, is a schematic partial cross-sectional view of the base material and other elements for illustrating the method for fabricating the display device according to the first embodiment.

FIG. 13, is a schematic partial cross-sectional view of the base material and other elements for illustrating the method for fabricating the display device according to the first embodiment.

FIG. 16A is a schematic partial cross-sectional view of a base material and other elements for illustrating a method for fabricating the display device according to the first variation of the first embodiment.

FIG. 16B is a schematic partial cross-sectional view of the base material and other elements for illustrating the method for fabricating the display device according to the first variation of the first embodiment.

FIG. 16B, is a schematic partial cross-sectional view of the base material and other elements for illustrating the method for fabricating the display device according to the first variation of the first embodiment.

FIG. 17, is a schematic partial cross-sectional view of the base material and other elements for illustrating the method for fabricating the display device according to the first variation of the first embodiment.

FIG. 18, is a schematic partial cross-sectional view of the base material and other elements for illustrating the method for fabricating the display device according to the first variation of the first embodiment.

FIG. 21B is a schematic partial cross-sectional view of the base material and other elements for illustrating the method for fabricating the display device according to the second variation of the first embodiment.

FIG. 21B, is a schematic partial cross-sectional view of the base material and other elements for illustrating the method for fabricating the display device according to the second variation of the first embodiment.

FIG. 22, is a schematic partial cross-sectional view of the base material and other elements for illustrating the method for fabricating the display device according to the second variation of the first embodiment.

FIG. 23, is a schematic partial cross-sectional view of the base material and other elements for illustrating the method for fabricating the display device according to the second variation of the first embodiment.

FIG. 31 is a schematic cross-sectional view of a portion indicated by F-F in FIG. 28.

FIG. 33, is a schematic partial cross-sectional view of the base material and other elements for illustrating the method for fabricating the display device according to the second embodiment.

FIG. 34, is a schematic partial cross-sectional view of a base material and other elements for illustrating the method for fabricating the display device according to the second embodiment.

FIG. 35, is a schematic partial cross-sectional view of the base material and other elements for illustrating the method for fabricating the display device according to the second embodiment.

FIG. 39 is an appearance view of a see-through head mounted display.

DESCRIPTION OF EMBODIMENTS

Figure 1:
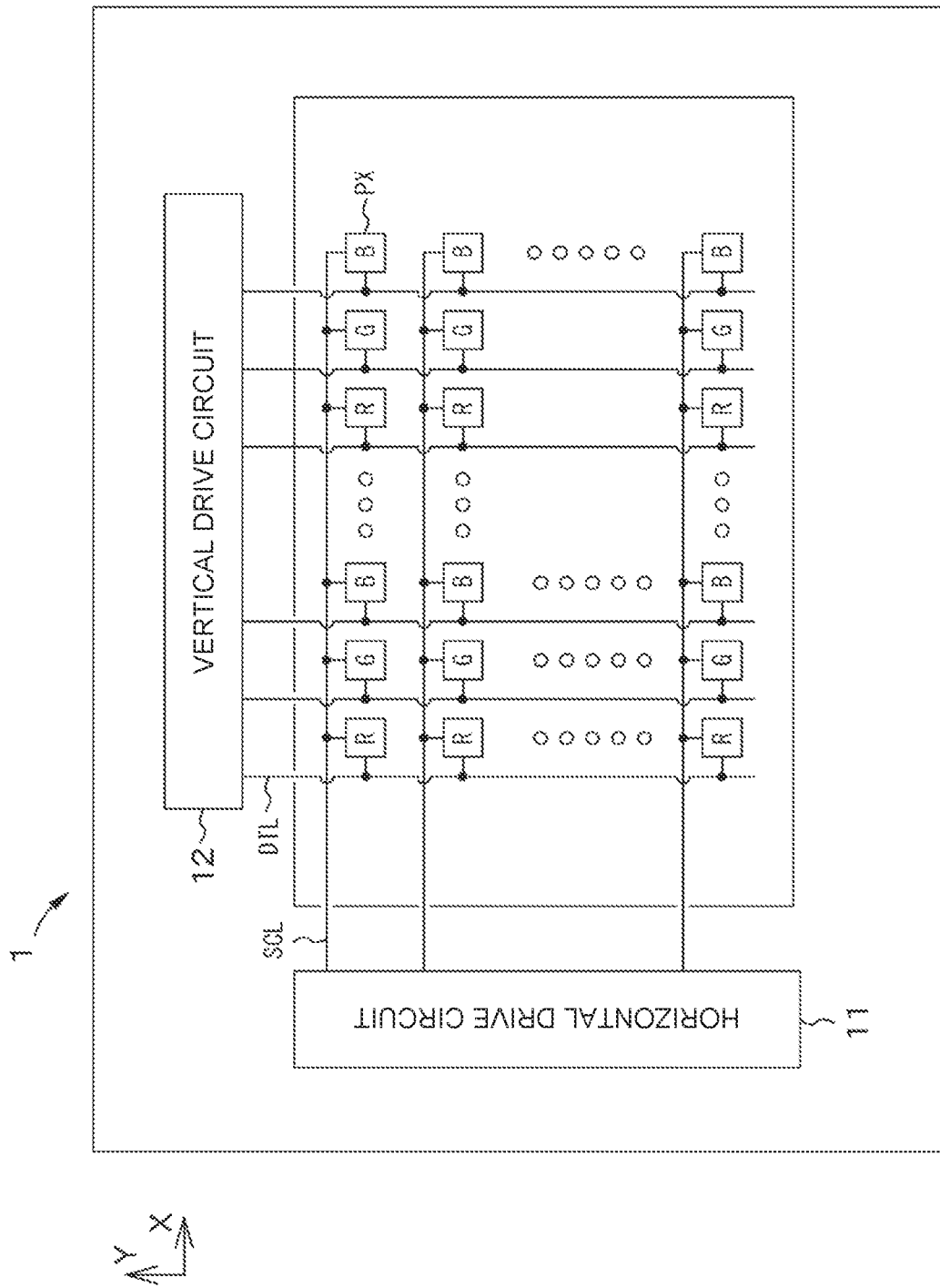
FIG. 1 is a schematic plan view of a display device according to a first embodiment of the present disclosure.

The following describes the present disclosure on the basis of embodiments by referring to the drawings. The present disclosure is not limited to the embodiments, and various numerical values and materials in the embodiments are exemplary. In the following descriptions, the same reference signs will be used for the same elements or elements having the same functions, and redundant descriptions will be omitted. Descriptions are given in the following order.

1. General Descriptions Pertaining to Display Device, Method for Fabricating Display Device, and Electronic Instrument according to Present Disclosure
2. First Embodiment
3. Various Variations of First Embodiment
4. Second Embodiment
5. Descriptions of Electronic Instrument
6. Others General Descriptions Pertaining to Display Device, Method for Fabricating Display Device, and Electronic Instrument According to Present Disclosure With respect to a display device according to the present disclosure, a display device used for an electronic instrument according to the present disclosure, and a display device provided by a method for fabricating a display device according to the present disclosure (each may hereinafter be simply referred to as "the display device of the present disclosure"), light emitting elements are each formed by forming a light-transmissive upper electrode and then sequentially stacking a light emitting unit and a lower electrode formed from a metal material on the upper electrode.

In this case, the light emitting unit may be formed from an organic layer including a light emitting layer. A so-called organic electroluminescence light emitting element is formed by sandwiching the organic layer between the upper electrode and the lower electrode. As described hereinafter, the organic layer of each of the light emitting elements may be formed to emit white light. Alternatively, the organic layer of each of the light emitting elements may be formed to emit red light, green light, or blue light. For example, the organic layer that emits white light may have a structure in which a hole injection layer, a hole transport layer, a red light emitting layer, a light emission separation layer, a blue light emitting layer, a green light emitting layer, an electron transport layer, and an electron injection layer are sequentially stacked. In some cases, micrometer-sized LED elements can be used as the light emitting units.

The display device of the present disclosure, which includes the various preferable configurations described above, may be configured such that a joining surface of a lower substrate in which drive circuits for driving the light emitting elements are formed is joined to a joining surface that an upper substrate in which the light emitting elements are formed has on the lower-electrode side. In this case, the upper substrate may include first connection parts disposed on the joining surface on the lower-electrode side so as to correspond to the respective light emitting elements, and the lower substrate may include second connection parts disposed on the joining surface of the lower substrate so as to correspond to the first connection parts. Joining the first and second connection parts allows the light emitting elements and the drive circuits for driving the light emitting elements to be electrically connected.

The display device of the present disclosure including the above-described various preferable configurations may be configured such that: upper electrodes are formed to correspond to the respective light emitting elements; and a lower electrode is formed as an electrode shared by each of the light emitting elements. In this case, the upper electrodes and the first connection parts may be connected via contact plugs passing through openings provided in the lower electrode. The contact plugs may be formed to be connected to bottom surfaces or side surfaces of the upper electrodes. In this case, alternatively, the organic layers may each be formed such that a hole injection layer is located on the upper-electrode side and an electron injection layer is located on the lower-electrode side.

Alternatively, the display device of the present disclosure including the above-described various preferable configurations may be configured such that: an upper electrode is formed as an electrode shared by each of the light emitting elements; and lower electrodes are formed to correspond to the respective light emitting elements. In this case, the lower electrodes and the first connection parts may be connected via contact plugs. In this case, alternatively, the organic layer may each be formed such that a hole injection layer is located on the lower-electrode side and an electron injection layer is located on the upper-electrode side.

The display device of the present disclosure including the above-described various preferable configurations may be configured such that the organic layer of each light emitting element is formed to emit white light. In this configuration, the organic layers of the light emitting elements can be formed to be the same in composition, thereby providing an advantage that the process of forming the organic layers for the display device can be simplified.

The organic layer that emits white light may have a so-called tandem structure in which a plurality of light emitting layers are connected via a charge generation layer or an intermediate electrode. For example, a light emitting unit that emits white light can be formed by stacking light emitting layers for red light emission, green light emission, and blue light emission, or by stacking light emitting layers for yellow light emission and blue light emission. The hole transport material, the hole transport material, the electron transport material, and the organic light emitting material forming the organic layers are not particularly limited, and well-known materials can be used as these materials.

In order to implement color display with this configuration, color filters for colors to be displayed may be disposed, as appropriate, so as to correspond to the respective light emitting elements. The color filters may be formed from, for example, a resin material containing a pigment or a dye.

Alternatively, the display device of the present disclosure including the above-described various preferable configurations may be formed such that the organic layer of each light emitting element is formed to emit red light, green light, or blue light. This configuration involves a complicated process of forming the organic layers of the display device but has the advantage of high light emission efficiency. Also in this case, color filters for colors to be displayed may be disposed in order to improve, for example, the color purity.

The display device of the present disclosure including the above-described various preferable configurations may be configured such that the light emitting elements have a resonator structure for resonating light generated by the light emitting units. For example, the resonator structure can be formed by disposing an organic layer between a semi-transmissive reflection film and the lower electrode and setting a prescribed distance as an optical distance between the semi-transmissive reflection film and the lower electrode.

For example, let $\Phi$ be a phase shift of reflected light that occurs between the semi-transmissive reflection film and the lower electrode; L, the optical distance between the lower electrode and the semi-transmissive reflection film; $\lambda$, the peak wavelength of the spectrum of light to be extracted. In this case, the optical distance L may satisfy $2L/\lambda + \Phi/2\pi = m$ (m is an integer).

Alternatively, the display device of the present disclosure including the above-described various preferable configurations may be configured such that condensing lenses provided so as to correspond to the respective light emitting elements may be formed in the upper substrate. The efficiency of utilization of light can be enhanced by adjusting a light path by means of the condensing lenses, so that the luminance of a display image can be increased. The shape of the condensing lenses is not particularly limited, and a convex lens shape, a concave lens shape, a box lens shape, or the like may be selected, as appropriate, according to specifications.

The display device of the present disclosure including the above preferable configuration can have a configuration for color display. In some cases, a configuration for so-called monochrome display may be used.

In the case of the configuration for color display, each single pixel may be formed from a plurality of subpixels. Specifically, each single pixel may be formed from three subpixels, namely a red-display subpixel, a green-display subpixel, and a blue-display subpixel. Furthermore, each single pixel may be formed from a set of these three types of subpixels and one or more types of additional subpixels (e.g., a set further including a subpixel that emits white light to improve the luminance, a set further including a subpixel that emits complementary color light to expand a color reproduction range, a set further including a subpixel that emits yellow light to expand the color reproduction range, and a set further including subpixels that emit yellow light and cyan light to expand the color reproduction range).

Some resolutions for image display, such as VGA (640, 480), S-VGA (800, 600), XGA (1024, 768), APRC (1152, 900), S-XGA (1280, 1024), U-XGA (1600, 1200), HD-TV (1920, 1080), and Q-XGA (2048, 1536), including (1920, 1035), (720, 480), and (1280, 960), can be presented as examples of the value of the pixels of the display device. However, the invention is not limited to these values.

An insulating film or the like that forms partitions between the light emitting elements may be formed from a material selected, as appropriate, from publicly-known inorganic and organic materials. For example, the insulating film or the like can be formed using a combination of a well-known film formation method, such as a physical deposition method (PVD method) (e.g., vacuum deposition method, sputtering method) or any type of chemical vapor deposition method (CVD method), and a well-known patterning method such as an etching method or a lift-off method.

The display device according to the present disclosure is not particularly limited for the configuration of, for example, the drive circuits for controlling light emission of the light emitting elements. The configuration of transistors forming the drive circuits is not particularly limited. P-channel field effect transistors or n-channel field effect transistors may be used.

A semiconductor material, a glass material, and a plastic material can be presented as examples of a constituent material for the base material. The drive circuits may be formed from transistors formed on a semiconductor base material in a manner such that: the semiconductor base material, which is formed from, for example, silicon, is provided with well regions; and the transistors are formed in the wells. Meanwhile, the drive circuits may be formed from, for example, thin film transistors in a manner such that semiconductor thin films are formed on a base material formed from a glass material or a plastic material. Well-known configurations and structures can be used as various wirings.

For example, the upper electrode can be formed from a transparent conductive material such as indium zinc oxide or indium tin oxide. Alternatively, the upper electrode may be formed from, for example, a metal or an alloy and made thin to the extent that light transmittance is attained.

The lower electrode can be formed from a metal material such as aluminum (Al), an aluminum alloy, silver (Ag), or a silver alloy. The thickness of the upper electrode preferably falls within a range of 100 to 300 nanometers.

Various conditions herein may be exactly satisfied or substantially satisfied. With respect to satisfaction of the conditions, the existence of various variations resulting from the design or fabricating of, for example, the display device is acceptable. Meanwhile, the drawings used in the following description are schematic. For example, FIG. 3 (described hereinafter) illustrates a cross-sectional structure of the display device, but does not indicate the ratio between, for example, a width, a height, and a thickness.

First Embodiment

The first embodiment pertains to a display device, a method for fabricating the display device, and an electronic instrument according to the present disclosure.

FIG. 1 is a schematic plan view of the display device according to the first embodiment of the present disclosure. A display device 1 uses an active matrix scheme. As illustrated in FIG. 1, the display device 1 includes pixels PX arranged in a matrix and various circuits such as a horizontal drive circuit 11 and a vertical drive circuit 12 for driving the pixels PX. The display device 1 is provided by integrating various circuits such as the horizontal drive circuit 11 and the vertical drive circuit 12. In some cases, the various circuits may be formed as separate bodies.

Reference sign SCL denotes scanning lines for scanning the pixels PX, and reference signs DTL denotes signal lines for supplying various voltages to the pixels PX. For example, M pixels PX may be arranged in a horizontal direction, and N pixels may be arranged in a vertical direction, i.e., M×N pixels PX may be arranged in a matrix. The display device 1 is a color display device. Reference signs R, G, and B respectively denote pixels PX for displaying red, green, and blue. Although the display device 1 includes, for example, feeder lines in addition to the scanning lines SCL and the signal lines DTL, such lines are omitted in FIG. 1 for convenience of illustration.

For example, M pixels PX may be arranged in a horizontal direction, and N pixels may be arranged in a vertical direction, i.e., M×N pixels PX may be arranged in a matrix. In the example illustrated in FIG. 1, the horizontal drive circuit 11 and the vertical drive circuit 12 are each disposed on one edge side of the display device 1. However, this is merely an example.

Figure 2:
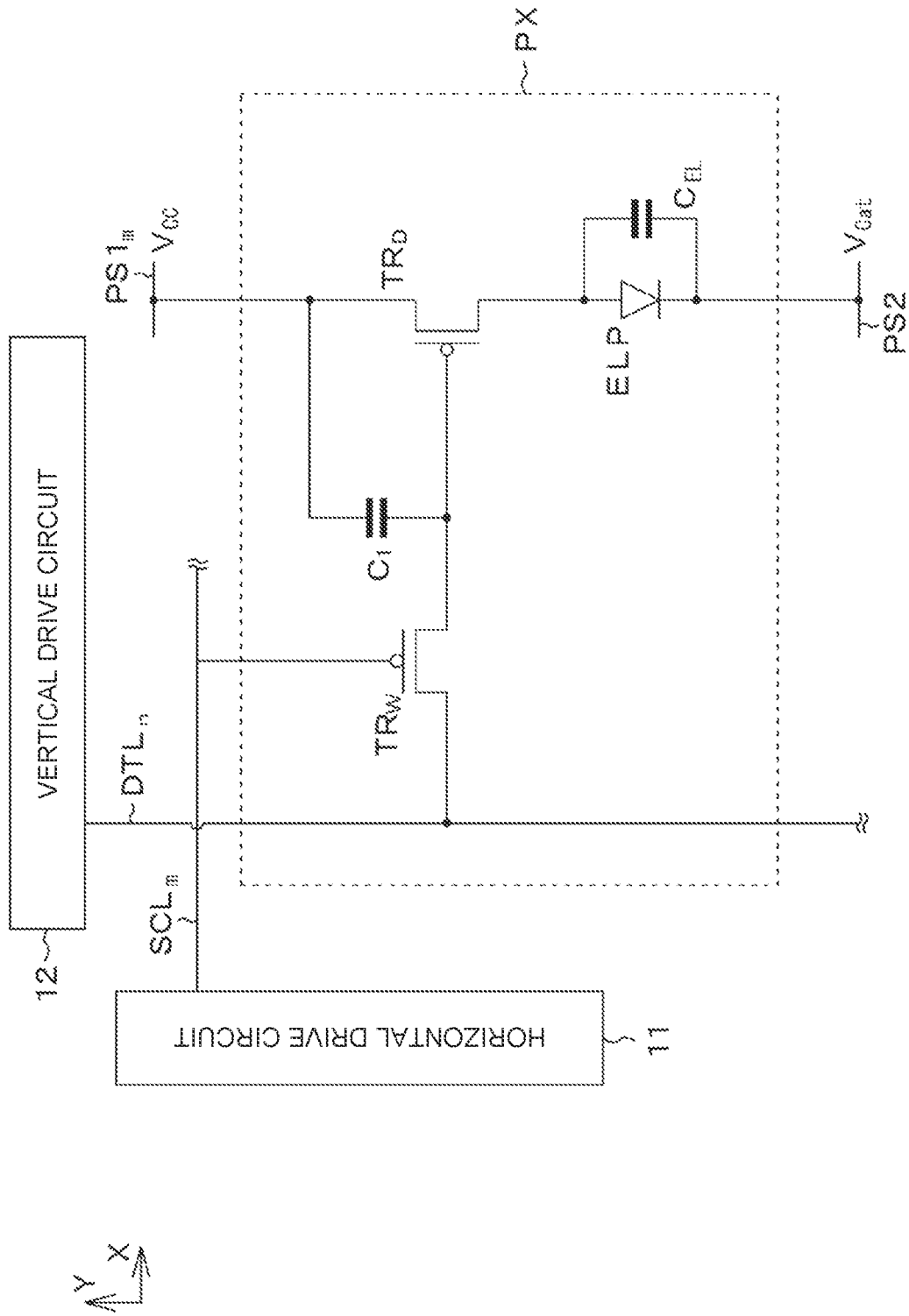
FIG. 2 is a schematic circuit diagram for illustrating a connection relationship at a pixel at an m-th row and an n-th column.

FIG. 2 is a schematic circuit diagram for illustrating a connection relationship at a pixel at an m-th row and an n-th column.

In the display device 1, the pixels PX, which each include a light emitting element ELP, are arranged in a two-dimensional matrix in such a manner as to each connect to a scanning line SCL extending in a row direction (X direction in FIG. 1) and a signal line DTL extending in a column direction (Y direction in FIG. 1).

The display device 1 further includes feeder lines PS1 for supplying a drive voltage to the pixels and a shared feeder line PS2 connected to all the pixels PX in a shared manner. The feeder lines PS1 are supplied with, for example, a prescribed drive voltage $V_{cc}$ from a power supply unit (not illustrated). The shared feeder line PS2 is supplied with an identical voltage $V_{Cat}$ (e.g., ground potential).

The display device 1 includes M scanning lines SCL and M feeder lines PS1. Pixels PX on a m-th row (m=1, 2 ..., P) are connected to a m-th scanning line $SCL_m$ and a m-th feeder line $PS1_m$, forming one row of display elements. Note that FIG. 2 only depicts the scanning line $SCL_m$ and the feeder line $PS1_m$.

The number of signal lines DTL is N. Pixels PX on a n-th column (n=1, 2 ..., N) are connected to a n-th signal line $DTL_n$. Note that FIG. 2 only depicts the signal line $DTL_n$.

For example, the display device 1 may be a color display device. Each single pixel PX forms one subpixel. The display device 1 is line-sequentially scanned on a row-by-row basis by a scanning signal from the horizontal drive circuit 11. A pixel PX located at the m-th row and the n-th column may be referred to as a (n, m)-th pixel PX.

In the display device 1, the M pixels PX arranged on the m-th row are concurrently driven. In other words, the timings of emission/non-emission of M pixels PX arranged in the row direction are controlled in units of rows that the pixels PX belong to. When the display device 1 is line-sequentially scanned on a row-by-row basis, a scanning period (so-called horizontal scanning period) per row is less than (1/FR)×(1/P) seconds, where FR is a display frame rate of the display device 1 (times/second).

A pixel PX is formed from a light emitting element ELP and a drive circuit for driving the light emitting element ELP. The light emitting element ELP is formed from an organic electroluminescence light emitting element. The drive circuit is formed from a write transistor $TR_W$, a drive transistor $TR_D$, and a capacitor section $C_1$. The light emitting element ELP emits light upon a current flowing through the light emitting element ELP via the drive transistor $TR_L$. Each transistor is formed from a p-channel field effect transistor.

In the pixel PX, one source/drain region of the drive transistor $TR_D$ is connected to one end of the capacitor section $C_1$ and the feeder line PS1, and another source/drain region of the drive transistor $TR_D$ is connected to one end (specifically, anode electrode) of the light emitting element ELP. A gate electrode of the drive transistor $TR_D$ is connected to the other source/drain region of the write transistor $TR_W$ and is connected to another end of the capacitor section $C_1$.

One source/drain region of the write transistor $TR_W$ is connected to the signal line DTL, and a gate electrode of the write transistor $TR_W$ is connected to the scanning line SCL.

Another end (specifically, cathode electrode) of the light emitting element ELP is connected to the shared feeder line PS2. A prescribed cathode voltage $V_{Cat}$ is supplied to the shared feeder line PS2. Note that reference sign $C_{EL}$ denotes the capacitance of the light emitting element ELP.

The following describes an overview of the driving of a pixel PX. While a voltage corresponding to the luminance of an image to be displayed is supplied from the vertical drive circuit 12 to a signal line DTL, placing a write transistor $TR_W$ in a conductive state by using a scanning signal from the horizontal drive circuit 11 causes the voltage corresponding to the luminance of the image to be displayed to be written to a capacitor section $C_1$. After the write transistor $TR_W$ is placed in a non-conductive state, a light emitting element ELP is caused to emit light by a current flowing through a drive transistor $TR_D$ in accordance with the voltage held by the capacitor section $C_1$.

The present disclosure does not particularly limit the configuration of the drive circuits for controlling light emission of the light emitting elements ELP. Accordingly, the configuration illustrated in FIG. 2 is merely an example, and various configurations are possible for the display device according to the present disclosure.

Next, a detailed structure of the display device 1 will be described.

Figure 3:
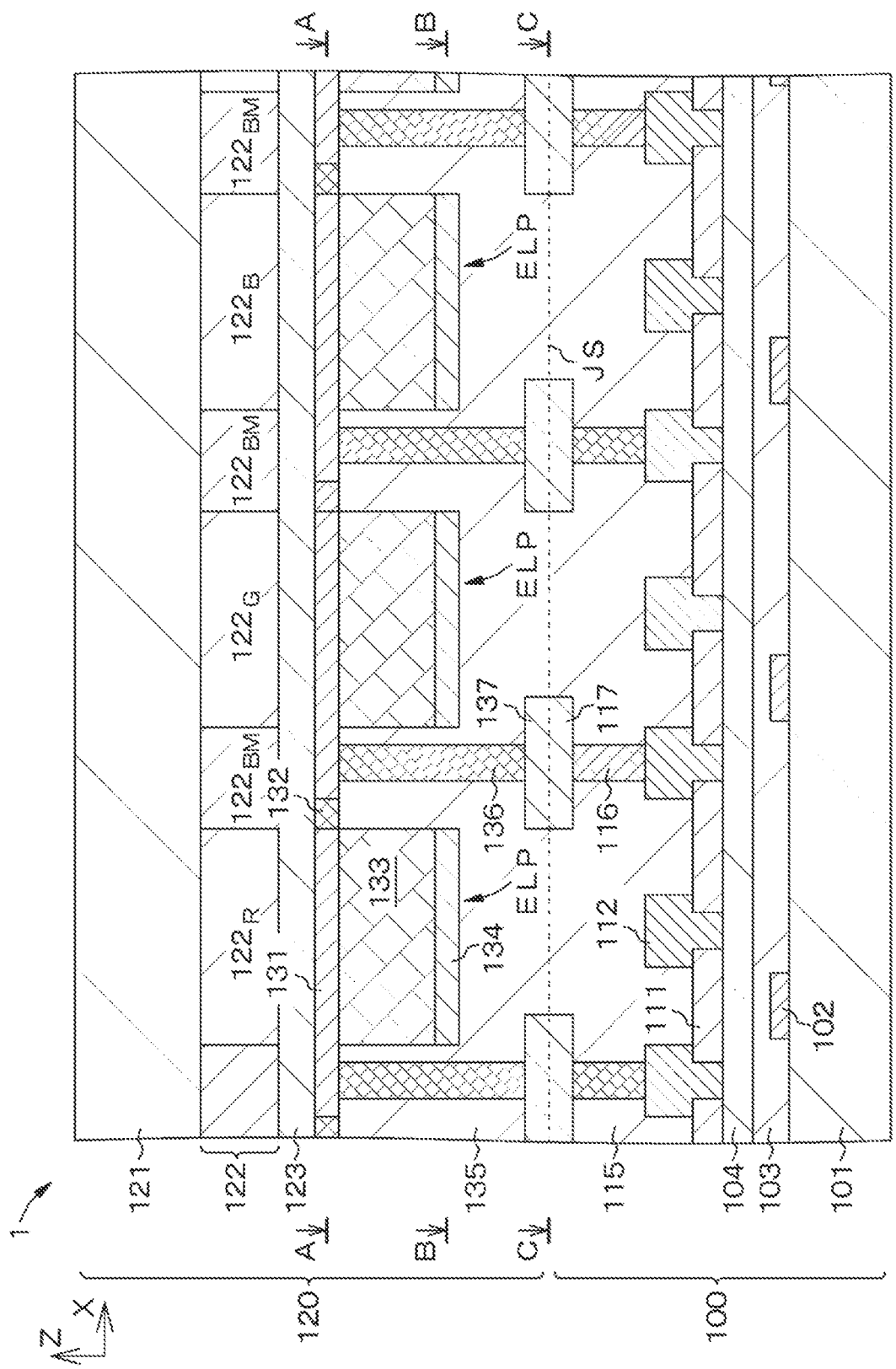
FIG. 3 is a schematic partial cross-sectional view of the display device according to the first embodiment.

FIG. 3 is a schematic partial cross-sectional view of the display device according to the first embodiment.

In the display device 1, pixels each including a light emitting element ELP formed by stacking an upper electrode 131, a light emitting unit 133, and a lower electrode 134 are arranged in a two-dimensional matrix. As will be described hereinafter in detail with reference to FIGS. 10 and 11, the light emitting elements ELP are each formed by forming a light-transmissive upper electrode 131 and then sequentially stacking, onto the upper electrode 131, a light emitting unit 133 and a lower electrode 134 formed from a metal material. The light emitting unit 133 is formed from an organic layer including a light emitting layer. The upper electrode 131 is formed for each of the light emitting elements ELP. The lower electrode 134 is formed as an electrode shared by each of the light emitting elements ELP.

The upper electrode 131 is typically formed using, for example, a sputtering method. In the present disclosure, the light emitting unit 133 is stacked after the upper electrode 131 is formed. Thus, the light emitting unit 133 is not damaged in the process of forming the upper electrode 131. Accordingly, since damage to the light emitting unit 133 can be reduced, the luminance of the display device can be increased.

The display device 1 is configured such that a joining surface JS of a lower substrate 100 in which drive circuits for driving the light emitting elements ELP are formed is joined to a joining surface JS that an upper substrate 120 in which the light emitting elements ELP are formed has on the lower-electrode 134 side. The upper substrate 120 includes first connection parts 137 disposed on the joining surface JS on the lower-electrode 134 side so as to correspond to the respective light emitting elements ELP. The lower substrate 100 includes second connection parts 117 disposed on the joining surface JS of the lower substrate 100 so as to correspond to the first connection parts 137. Joining the first connection parts 137 to the second connection parts 117 allows the light emitting elements ELP and the drive circuits for driving the light emitting elements ELP to be electrically connected.

The following describes various components in detail by referring to FIG. 3.

First, descriptions are given of the lower substrate 100. The lower substrate 100 includes a base material 101, gate electrodes 102, a gate insulating film 103, a semiconductor material layer 104, an interlayer insulating film 111, source/drain electrodes 112, a planarization film 115, and contact plugs 116 and second connection parts 117 provided in openings of the planarization film 115.

The gate electrodes 102 are formed on the base material 101. The gate insulating film 103 is formed to cover the entirety of a surface of the base material 101, including the gate electrodes 102. The semiconductor material layer 104 is formed on the gate insulating film 103. The interlayer insulating film 111 is formed on the semiconductor material layer 104.

The source/drain electrodes 112 are connected to the source/drain regions of transistors via openings provided in the interlayer insulating film 111. The planarization film 115 is formed to cover the entire surface, including the source/drain electrodes 112. The contact plugs 116 are provided in the openings of the planarization film 115 and connected to the source/drain electrodes 112 of drive transistors. The second connection parts 117 are formed on the connection surface JS side of the planarization film 115 and connected to the source/drain electrodes 112 of the drive transistors via the contact plugs 116.

Although the drive circuits for the light emitting elements ELP include, for example, drive transistors $TR_D$ and write transistors $TR_W$, FIG. 3 depicts only the drive transistors $TR_D$ for convenience of illustration. The lower substrate 100 includes drive circuits formed from, for example, the above-described transistors and intended to drive the light emitting elements ELP.

For example, the base material 101 may be formed from a glass material, a semiconductor material, or a plastic material. Drive circuits including thin film transistors for controlling light emission of the light emitting elements ELP are formed on the base material 101.

For example, the gate electrodes 102 of the various transistors forming the drive circuits can be formed from polysilicon or a metal such as aluminum (Al). The gate insulating film 103 is provided on the entirety of the surface of the base material 101 so as to cover the gate electrodes 102. For example, the gate insulating film 103 can be formed from silicon oxide ($SiO_x$) or silicon nitride ($SiN_x$).

For example, the semiconductor material layer 104 can be formed on the gate insulating film 103 from amorphous silicon, polycrystalline silicon, or an oxide semiconductor. In addition, some regions of the semiconductor material layer 104 are doped with impurities so as to form source/drain regions. Furthermore, regions of the semiconductor material layer 104 each located between one source/drain region and another source/drain region and above a gate electrode 102 form channel regions. Thus, thin film transistors of a bottom-gate type are provided on the base material 101. Note that indications of the source/drain regions and the channel regions are omitted in FIG. 3.

The interlayer insulating film 111 is provided on the semiconductor material layer 104. For example, the interlayer insulating film 111 may be formed from silicon oxide ($SiO_x$), silicon nitride ($SiN_x$), or silicon oxynitride ($SiO_xN_y$). The source/drain electrodes 112 are connected to the semiconductor material layer 104 via contact holes provided in the interlayer insulating film 111. For example, the source/drain electrodes 112 may be formed from a metal such as aluminum (Al).

The planarization film 115 is formed to cover and planarize, for example, the drive circuits. For example, the planarization film 115 can be formed from an organic insulating film such as a polyimide-based resin, an acrylic resin, or a novolac-based resin, or an inorganic insulating film such as silicon oxide ($SiO_x$), silicon nitride ($SiN_x$), or silicon oxynitride ($SiO_xN_y$).

Next, descriptions are given of the upper substrate 120.

The upper substrate 120 includes a base material 121, color filters 122, a protective film 123, light emitting elements ELP each formed from an upper electrode 131, a light emitting unit 133, and a lower electrode 134, a planarization film 135, and contact plugs 136 and first connection parts 137 provided in openings of the planarization film 135. Reference sign 132 denotes an insulating section forming partitions between the upper electrodes 131.

The color filters 122 are formed on the base material 121. The color filters 122 include a red color filter $122_R$, a green color filter $122_G$, and a blue color filter $122_B$. Reference sign $122_{BM}$ denotes light blocking portions forming partitions between the color filters with different colors.

The protective film 123 is formed to cover the entirety of surfaces of the color filters 122. The upper electrodes 131 and the insulating section 132 are formed on the protective film 123. The upper electrodes 131 each have a light emitting unit 133 and the lower electrode 134 formed thereon so as to form a light emitting element ELP. The planarization film 135 is formed to cover the entire surface, including the light emitting elements ELP.

The contact plugs 136 are provided in the openings of the planarization film 135 and connected to the upper electrodes 131. The first connection parts 137 are formed on the connection surface JS side of the planarization film 135 and connected to the upper electrodes 131 of the light emitting elements ELP via the contact plugs 136.

As described above, the upper electrodes 131 are formed to correspond to the respective light emitting elements ELP, and the lower electrode 134 is formed as an electrode shared by each of the light emitting elements ELP. For example, a ground potential may be supplied to the lower electrode 134 from a feeder line PS2 (not illustrated). A light emitting element ELP emits light upon a voltage from a drive transistor being supplied to an upper electrode 131 via a contact plug 116, a second connection part 117, a first connection part 137, and a contact plug 136. For example, the contact plugs 116 and 136 and the connection parts 117 and 137 can be formed from a metal such as copper (Cu), titanium (Ti), or gold (Au).

As described above, the lower electrode 134 is formed as an electrode shared by each of the light emitting elements ELP. An increase in the resistance of the lower electrode 134 would cause the potential of the lower electrode 134 to change according to the positions of the pixels during the operation of the display device 1, thereby decreasing the uniformity of the display screen. In the present disclosure, the lower electrode 134 can be formed from a metal material and thus has high conductivity. The lower electrode, which is shared by each of the light emitting elements ELP, can be formed on the entire surface from a low-resistance continuous film, so that the potential of the lower electrode can be suppressed from changing according to the positions of the pixels, without adding, for example, auxiliary electrode wiring. Hence, the display screen of the display device 1 can have improved uniformity.

Figure 4:
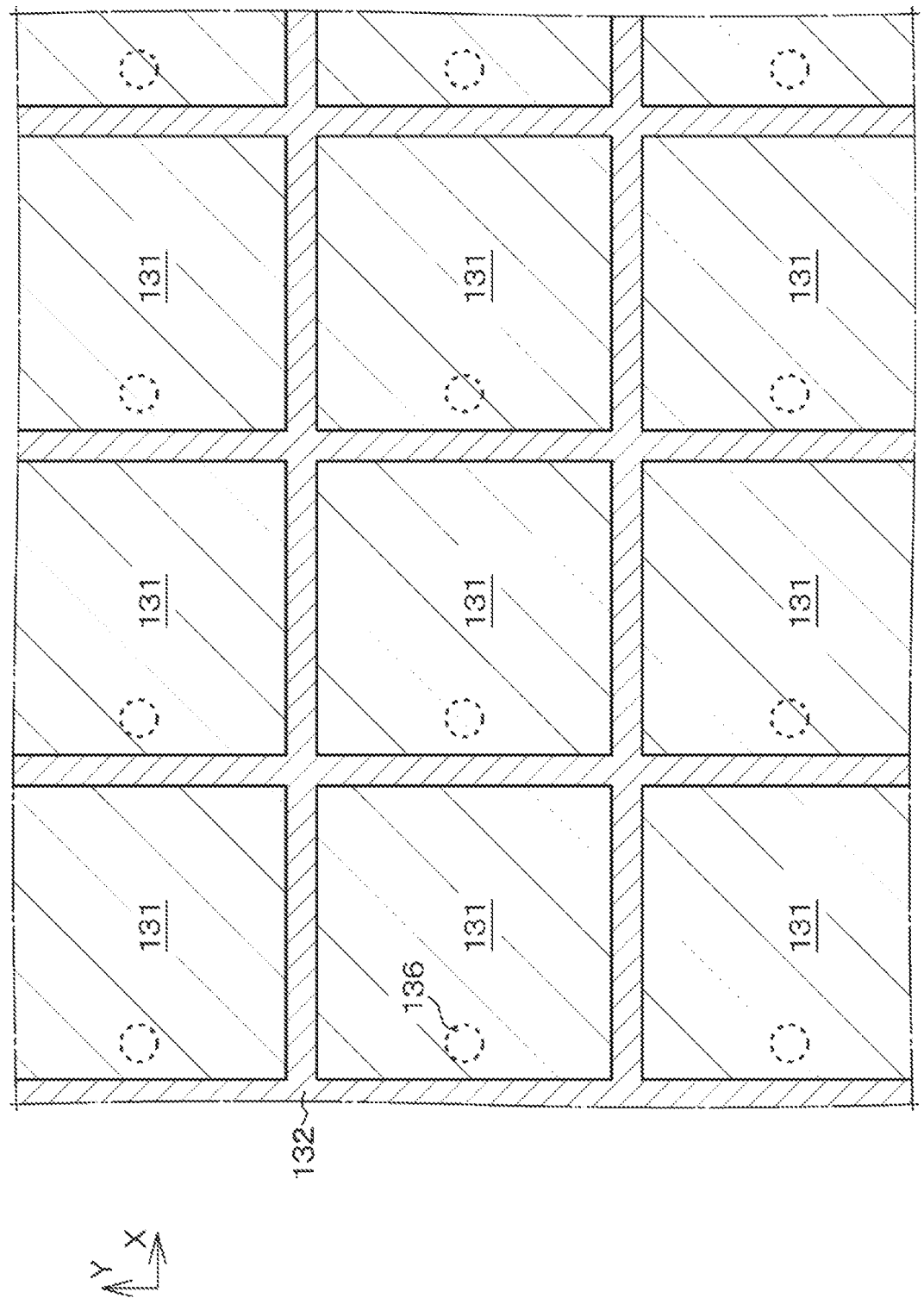
FIG. 4 is a schematic cross-sectional view of a portion indicated by A-A in FIG. 3.

Next, descriptions are given of a planar positioning relationship between the upper electrodes 131, the lower electrode 134, and the connection parts 117 and 137. FIG. 4 is a schematic cross-sectional view of a portion indicated by A-A in FIG. 3. FIG. 5 is a schematic cross-sectional view of a portion indicated by B-B in FIG. 3. FIG. 6 is a schematic cross-sectional view of a portion indicated by C-C in FIG. 3.

As illustrated in FIG. 4, the upper electrodes 131 are formed for the respective light emitting elements ELP, and the insulating section 132 forms partitions between adjacent upper electrodes 131. The contact plugs 136 are formed in contact with the bottom surfaces of the upper electrodes 131. As illustrated in FIG. 5, the lower electrode 134 is formed as an electrode shared by each of the light emitting elements ELP. However, the lower electrode 134 is provided with openings corresponding to the upper electrodes 131, and the contact plugs 136 are formed to pass through the openings. As illustrated in FIG. 6, the connection parts 117 and 137 are formed for the respective light emitting elements ELP. Accordingly, the upper electrodes 131 are connected to the first connection parts 137 via the contact plugs 136 passing through the openings provided in the lower electrode 134. The lower electrode 134 and the connection parts 117 and 137 are disposed to complement each other when seen in plan view. Hence, internal scattered light from the light emitting units 133 can be effectively prevented from being incident on the transistors disposed in the lower substrate 100.

Descriptions have been given of the lower substrate 100 and the upper substrate 120.

In the display device 1, the organic layers forming the light emitting units 133 are formed such that hole injection layers are located on the upper-electrode 131 side and electron injection layers are located on the lower-electrode 134 side. The organic layer forming the light emitting unit 133 of each light emitting element ELP may be formed to emit white light. Alternatively, the organic layer forming the light emitting unit 133 of each light emitting element ELP may be formed to emit red light, green light, or blue light.

Figure 7A:
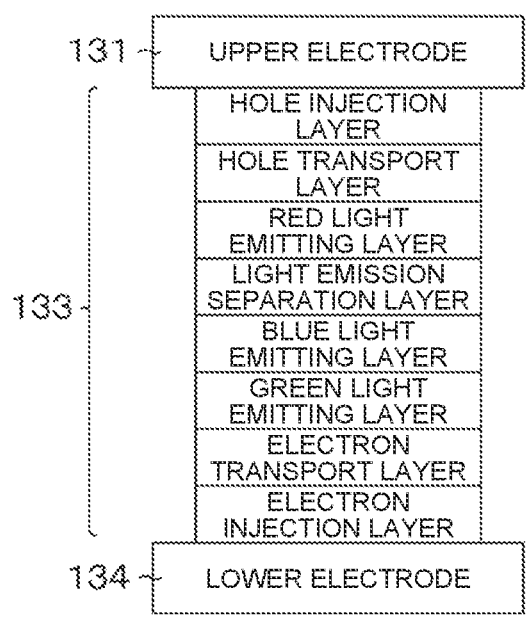
FIG. 7A is a schematic diagram for illustrating a stacking relationship of a light emitting unit in a pixel.
Figure 7B:
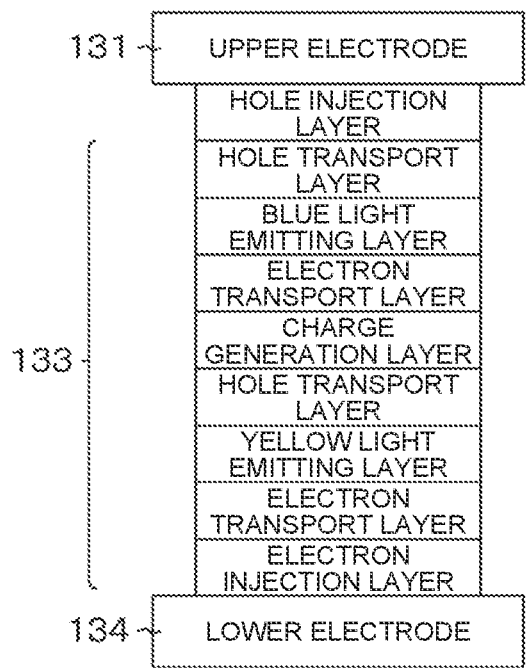
FIG. 7B is a schematic diagram for illustrating a stacking relationship of a light emitting unit in a pixel.

FIGS. 7A and 7B illustrate stacking examples provided when the organic layer of each light emitting element emits white light. FIG. 7A illustrates an example in which white light is emitted by a combination of a red light emitting layer, a blue light emitting layer, and a green light emitting layer. FIG. 7B illustrates an example in which white light is emitted by a combination of a blue light emitting layer and a yellow light emitting layer. FIGS. 8A, 8B, and 8C illustrate stacking examples provided when the organic layer of each light emitting element is formed to emit red light, green light, or blue light according to a color to be displayed.

A detailed structure of the display device 1 has been described. A method for fabricating the display device 1 includes a step of forming a light emitting element by forming, on a base material, an upper electrode that is light-transmissive, and then sequentially stacking, on the upper electrode, a light emitting unit and a lower electrode formed from a metal material. The same applies to other embodiments described hereinafter.

FIGS. 9 to 14 are schematic partial cross-sectional views of a base material and other elements for illustrating the method for fabricating the display device according to the first embodiment.

Figure 9A:
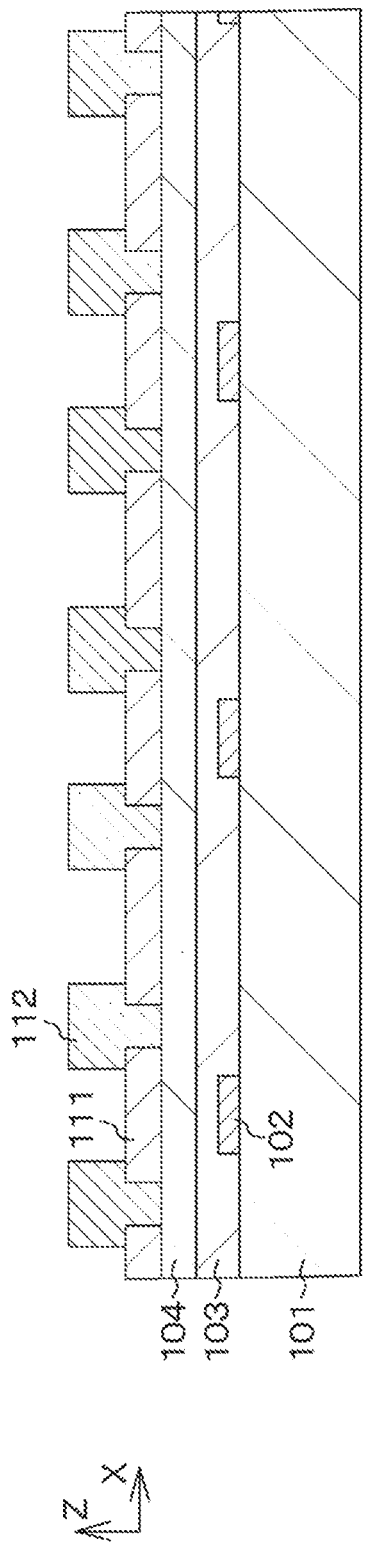
FIG. 9A is a schematic partial cross-sectional view of a base material and other elements for illustrating a method for fabricating the display device according to the first embodiment.
Figure 9B:
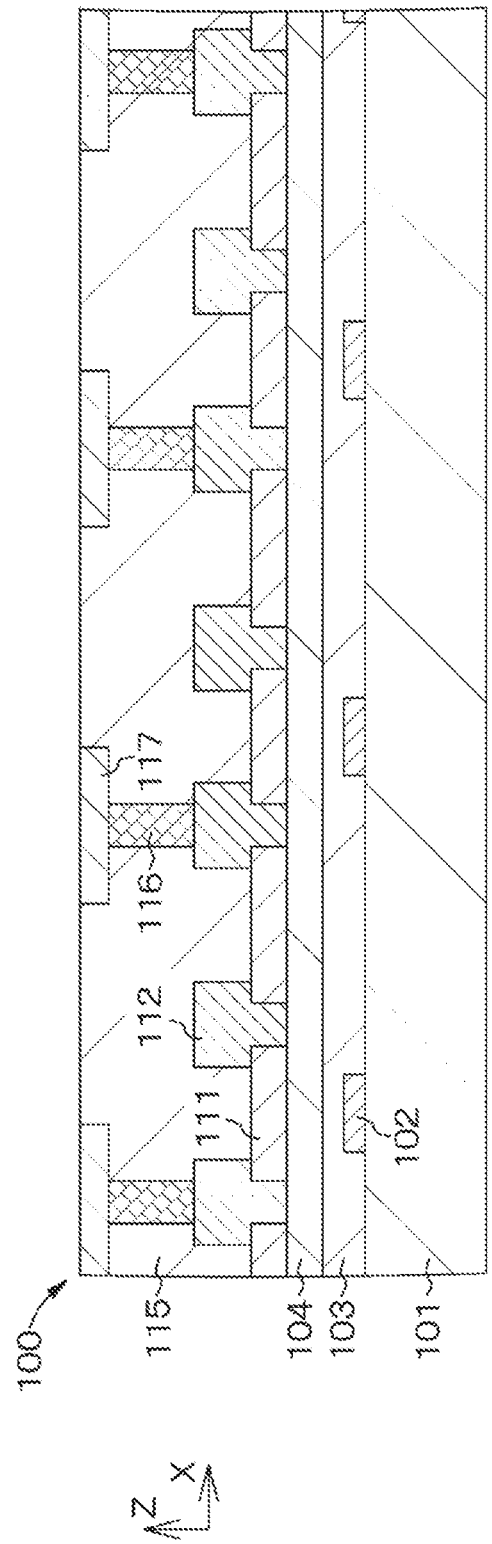
FIG. 9B is a schematic partial cross-sectional view of the base material and other elements for illustrating the method for fabricating the display device according to the first embodiment.

The following describes, in detail, the method for fabricating the display device 1 by referring to these drawings.
[Step 100] (See FIGS. 9A and 9B.)

First, a lower substrate 100 is produced in which drive circuits are formed. A base material 101 is prepared, and a predetermined film-formation and patterning process is performed on the base material 101, thereby forming drive circuits including thin film transistors (see FIG. 9A).

Next, a planarization film 115 is formed on the entirety of the surfaces of the drive circuits by using, for example, a spin coating method, a slit coating method, a sputtering method, or a CVD method. Afterward, openings are formed in the planarization film 115, and then contact plugs 116 and second connection parts 117 are formed in the openings (see FIG. 9B). The lower substrate 100 illustrated in FIG. 3 can be provided through this step.
[Step 110] (See FIGS. 10A, 10B, 11, 12 and 13.)

Next, an upper substrate is produced in which light emitting elements ELP are formed. A base material 121 is prepared, and a predetermined film-formation and patterning process is performed on the base material 121, thereby forming color filters 122. Subsequently, a protective film 123 is formed on the color filters 122. Afterward, ITO is formed on the entirety of the surface of the protective film 123 by using, for example, a sputtering method, and then upper electrodes 131 are formed by performing patterning, as appropriate (see FIG. 10A). Thereafter, an inorganic insulating film such as a silicon oxynitride is formed as an insulating section between the electrodes by using, for example, a sputtering method or a CVD method, and then planarization is performed to provide an insulating section 132 (see FIG. 10B).

Thereafter, organic layers for forming light emitting units 133 and a conductive film formed from, for example, aluminum (Al) and intended to form a lower electrode 134 are sequentially stacked on the entire surface, including the upper electrodes 131 which constitute anode electrodes. These films are preferably stacked through an integrated process in a vacuum state.

The organic layers for forming the light emitting units 133 and the conductive film formed from a metal material are sequentially stacked, so that a decrease in a reflectance caused by surface oxidation of the lower electrode 134 can be suppressed. In addition, a low electrical barrier can be maintained between the lower electrode 134 and the organic layers, so that the voltage of the light emitting elements ELP can also be reduced.

Figure 11:
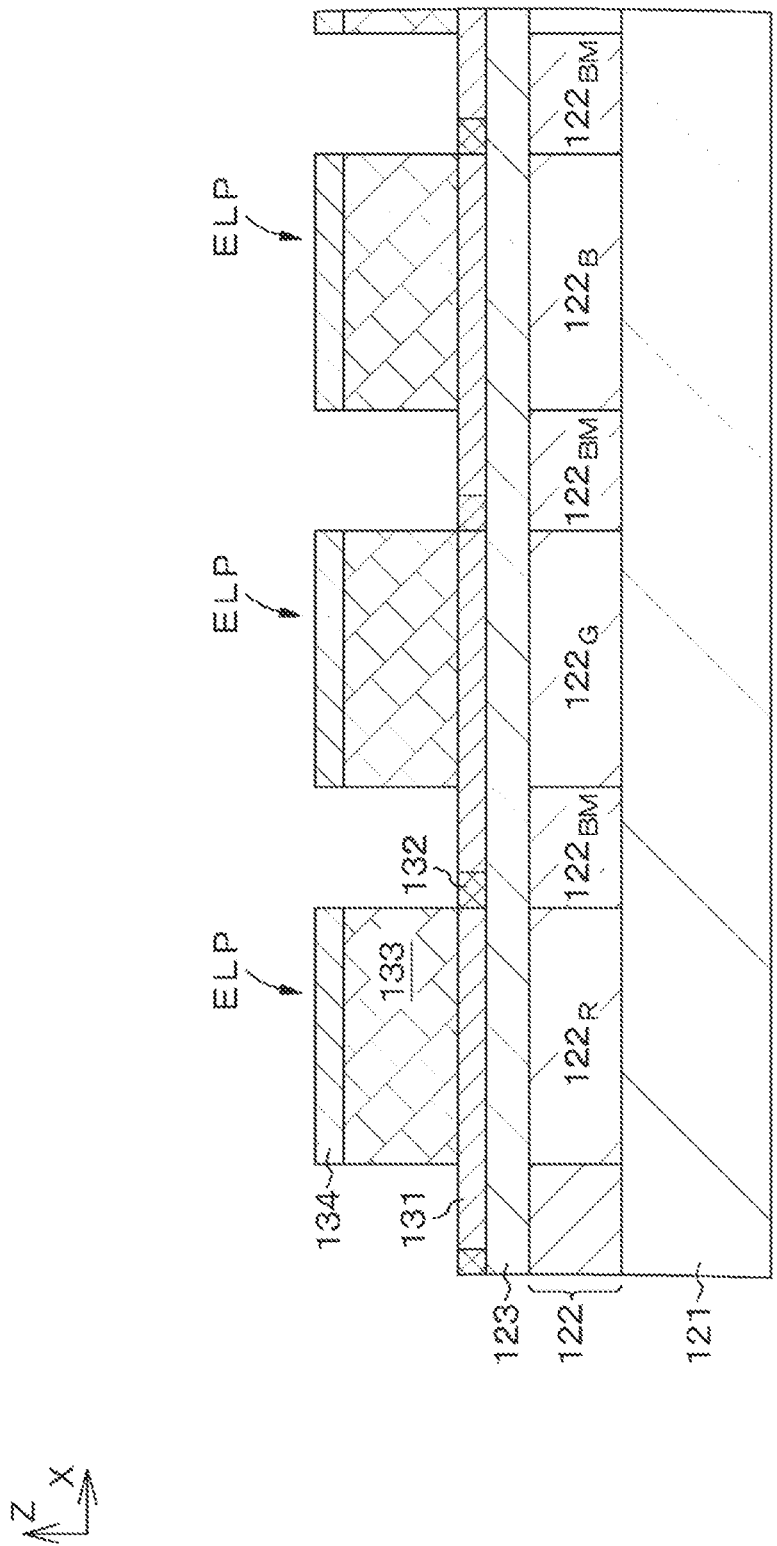
FIG. 11, which follows
Figure 12:
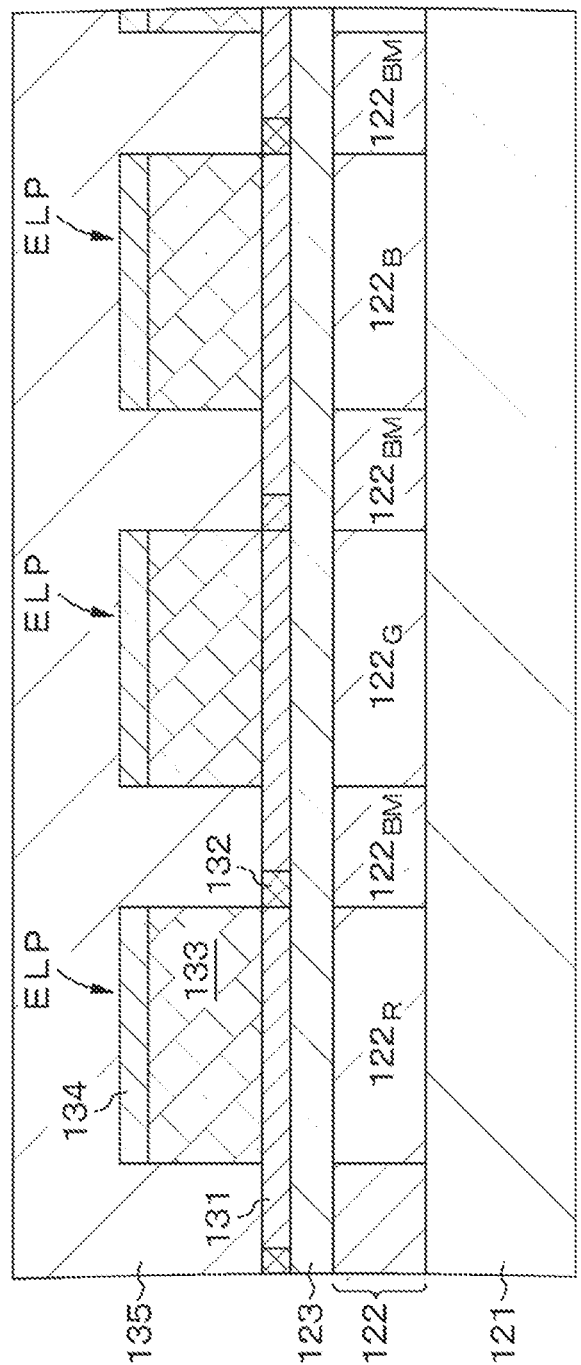
FIG. 12, which follows
Figure 13:
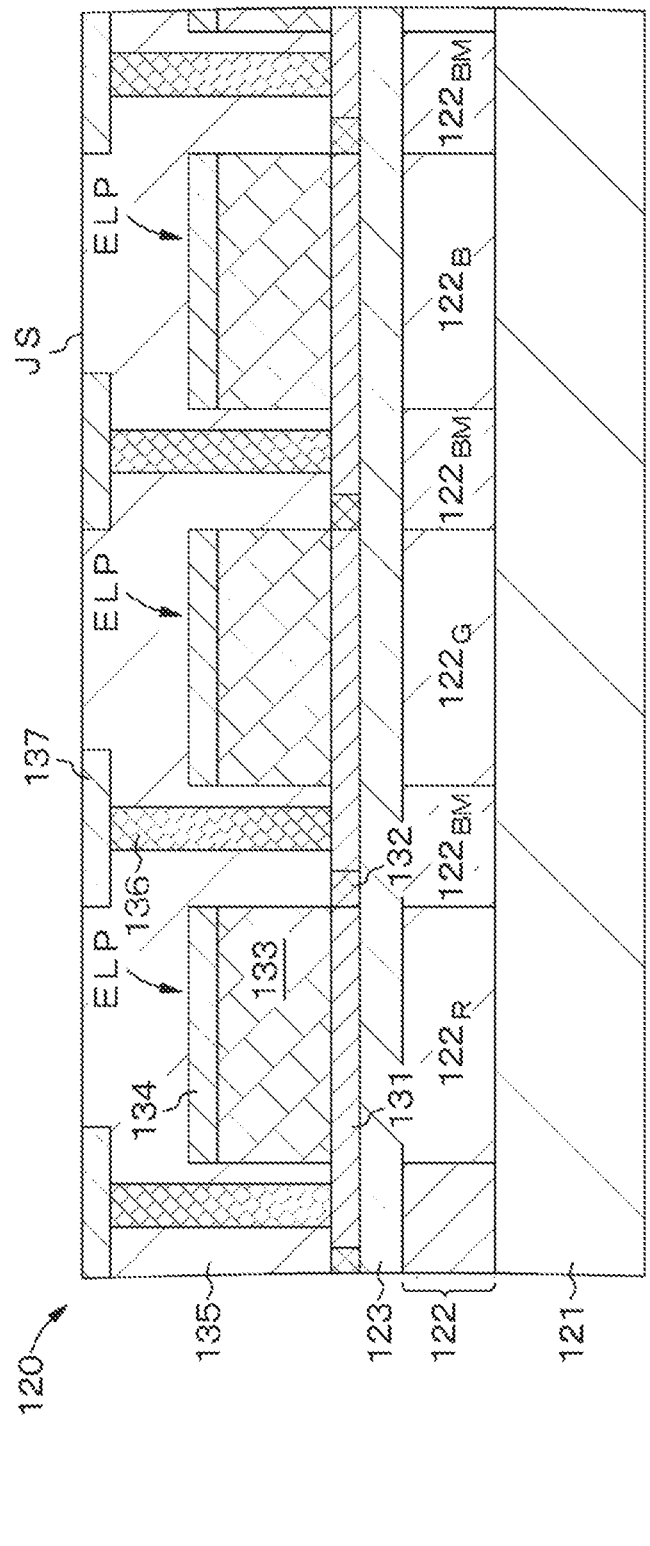
FIG. 13, which follows
Figure 14:
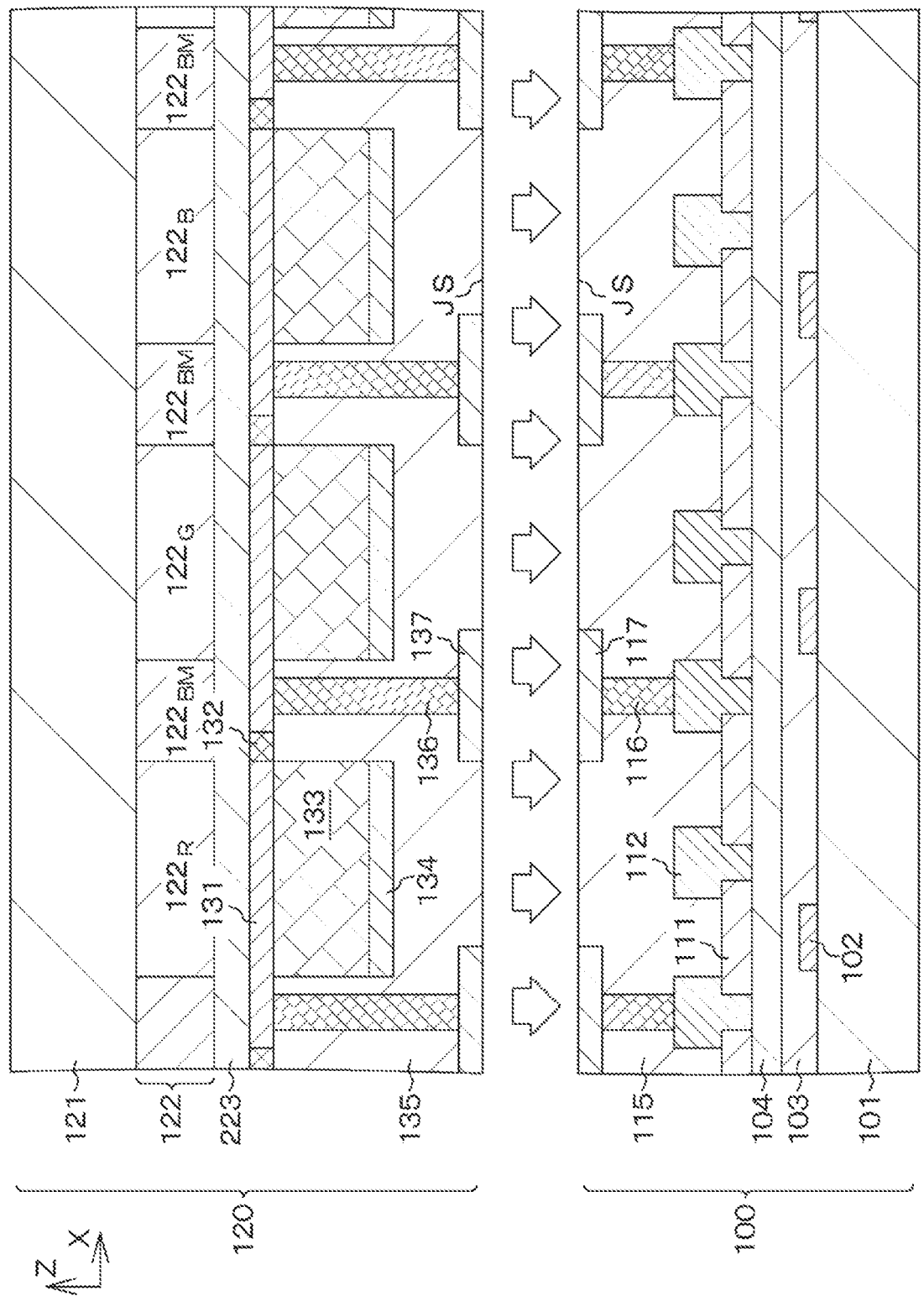
FIG. 14, which follows

Next, the organic layers and the conductive film can be processed by using, for example, a dry etching method, thereby providing light emitting elements ELP formed to correspond to the respective pixels (see FIG. 11). Thereafter, a planarization film 135 is formed on the entire surface, including the light emitting elements ELP (see FIG. 12). Then, contact holes are formed in the planarization film 135, and contact plugs 136 and first connection parts 137 are formed in the openings (see FIG. 13). The upper substrate 120 illustrated in FIG. 3 can be provided through this step.
[Step 120] (See FIG. 14)

Thereafter, connection surfaces JS where the first connection parts 137 and the second connection parts 117 are exposed are irradiated with, for example, Ar plasma so as to activate the connection surfaces JS. Then, the upper substrate 120 and the lower substrate 100 are caused to face each other such that the first connection parts 137 and the second connection parts 117 face each other, and under this condition, joining is performed at room temperature in vacuum. The display device 1 illustrated in FIG. 3 can be provided through this step.

The display device 1 has been described. The drawings and the like indicate that the planar shapes of the connection parts 117 and 137 are the same and that the centers thereof coincide with each other upon joining. However, this is merely an example. For example, the connection parts 117 and 137 may be connected to each other in a manner such that the connection parts 117 and 137 are offset from each other, in order to prevent external light from being incident on the transistors in the lower substrates. The same applies to other embodiments described hereinafter.

Various Variations of First Embodiment

The first embodiment can be variously modified. The following describes various variations by referring to the drawings.
(First Variation)

Figure 15:
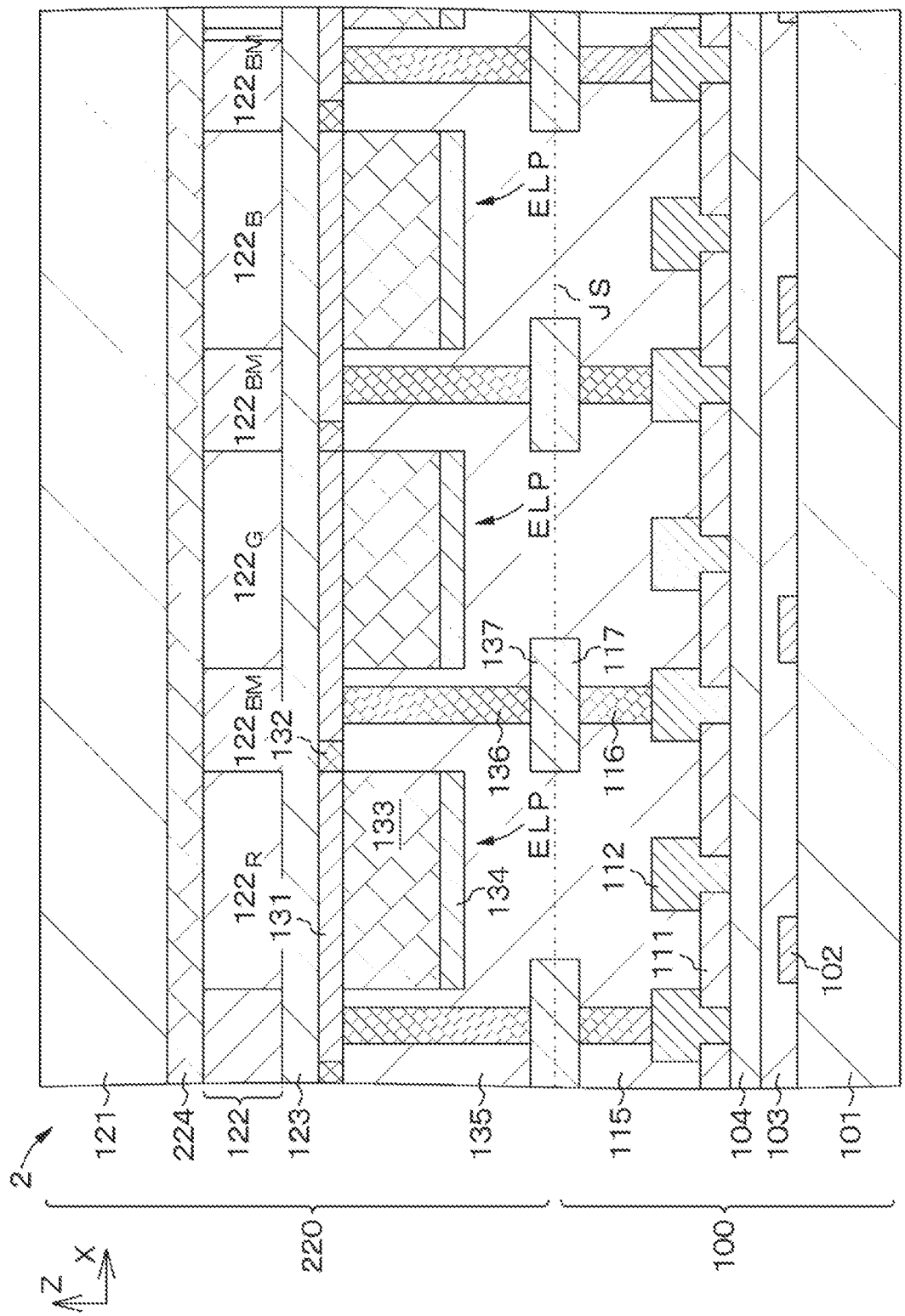
FIG. 15 is a schematic partial cross-sectional view of a display device according to a first variation of the first embodiment.

FIG. 15 is a schematic partial cross-sectional view of a display device according to a first variation of the first embodiment. The schematic plan view for illustrating the display device according to the first variation may be provided by replacing the display device 1 in FIG. 1 with a display device 2.

In the display device 1 illustrated in FIG. 3, the color filters 122, the light emitting elements ELP, and other elements are directly formed on the base material 121. In the display device 2 illustrated in FIG. 15, by contrast, the base material 121 is laminated on the color filters 122 by a sealing resin 224, with the light emitting elements ELP and the color filters 122 stacked over the lower substrate 100. This is a main difference from the display device 1.

FIGS. 16 to 19 are schematic partial cross-sectional views of a base material and other elements for illustrating a method for fabricating the display device according to the first variation.

The following describes, in detail, the method for fabricating the display device 2 by referring to these drawings.
[Step 200]

First, a step similar to step 100 described above with respect to the first embodiment is performed to provide the lower substrate 100 illustrated in FIG. 3.

Figure 17:
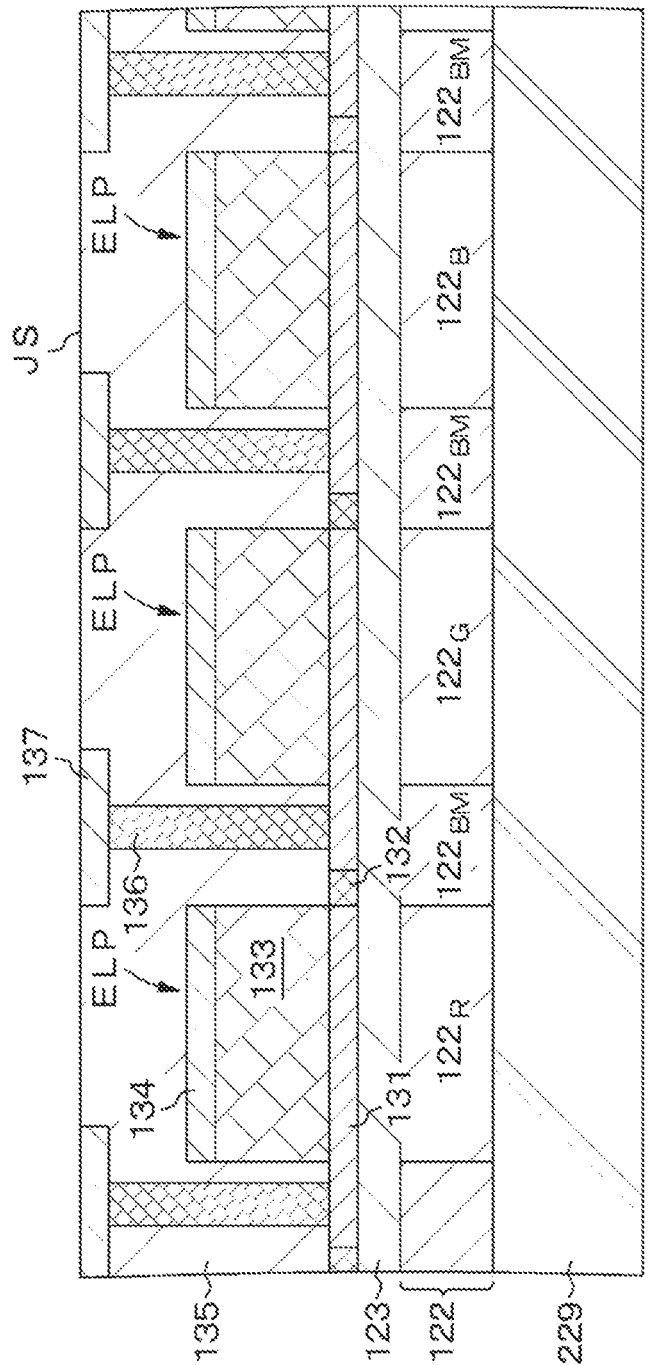
FIG. 17, which follows

[Step 210] (See FIGS. 16A, 16B, and 17.)

Next, a base material 229 formed from, for example, silicon is prepared. A step similar to step 110 described above with respect to the first embodiment is performed on the base material 229, not the base material 121. FIG. 16A corresponds to FIG. 10A in step 110. FIG. 16B corresponds to FIG. 10B in step 110. FIG. 17 corresponds to FIG. 13 in step 110.

Figure 18:
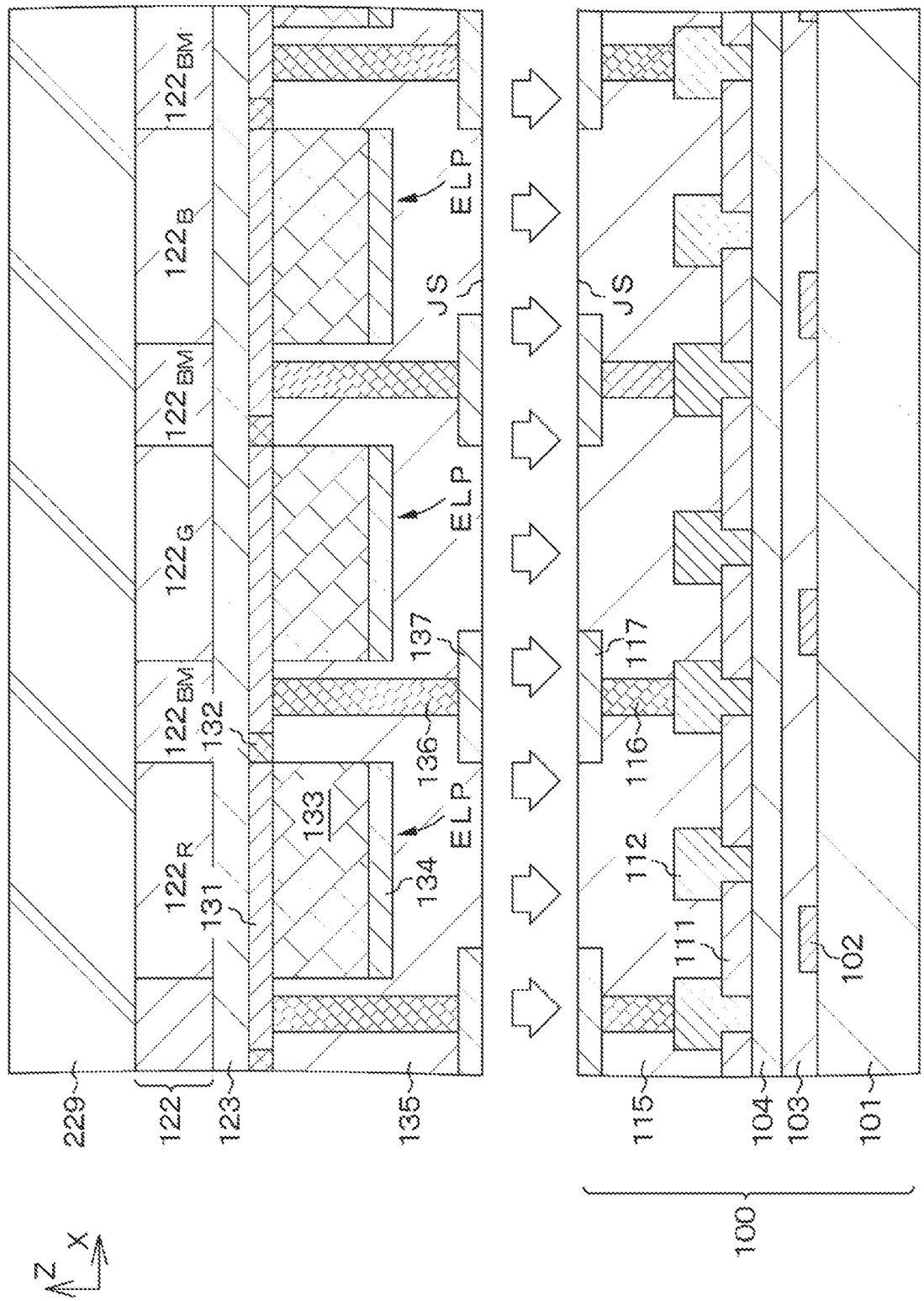
FIG. 18, which follows
Figure 19:
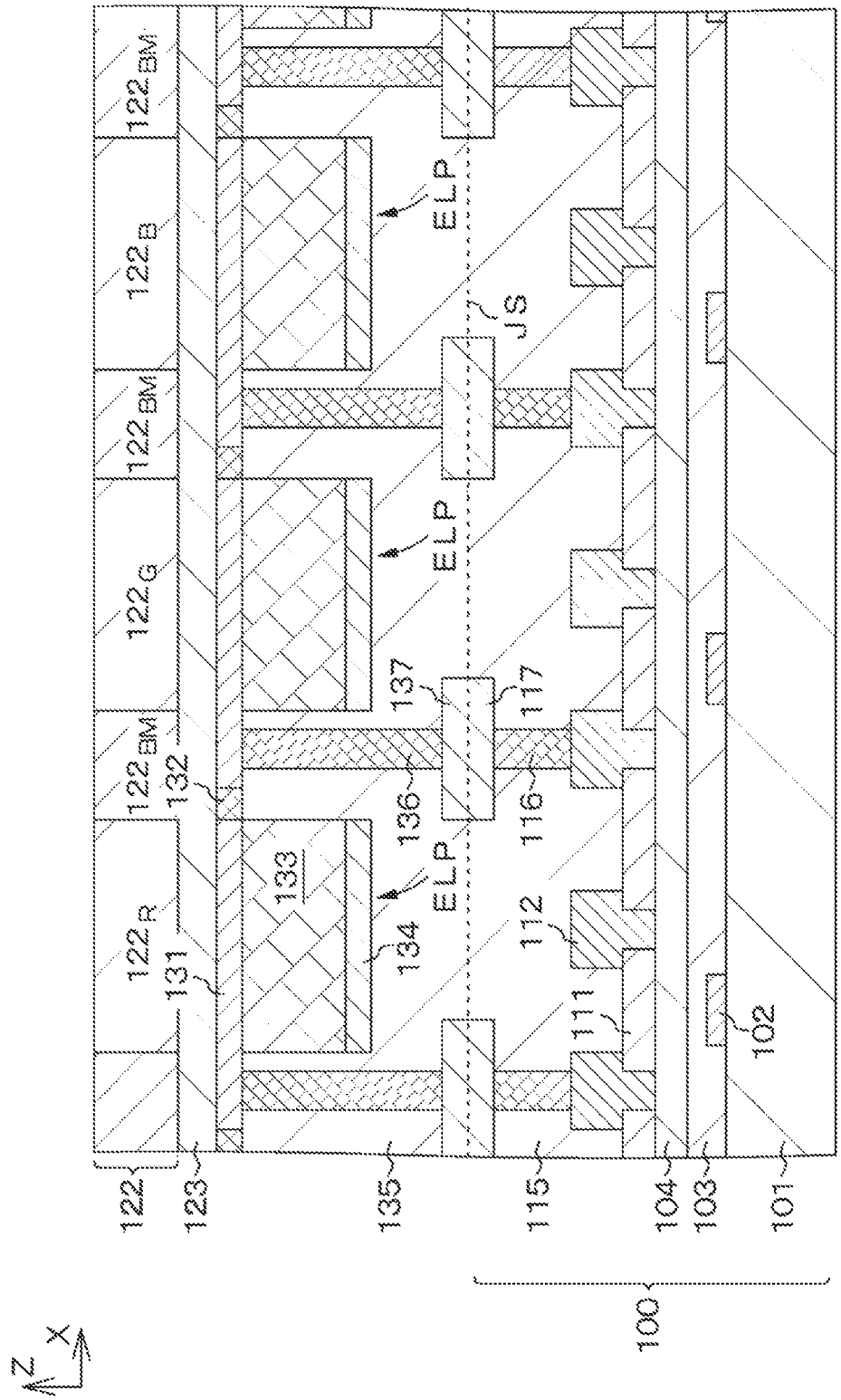
FIG. 19, which follows

[Step 220] (See FIGS. 18 and 19.)

Then, a step similar to step 120 described above with respect to the first embodiment is performed such that the connection surface JS of the lower substrate and the connection surface JS of the planarization film 135 formed on the base material 229 side face each other, and under this condition, joining is performed at room temperature in vacuum (see FIG. 18). Next, the base material 229 is removed (see FIG. 19), and the base material 121 is laminated onto the color filters 122 using the sealing resin 224. The display device 2 illustrated in FIG. 15 can be provided through this step.

(Second Variation)

Figure 20:
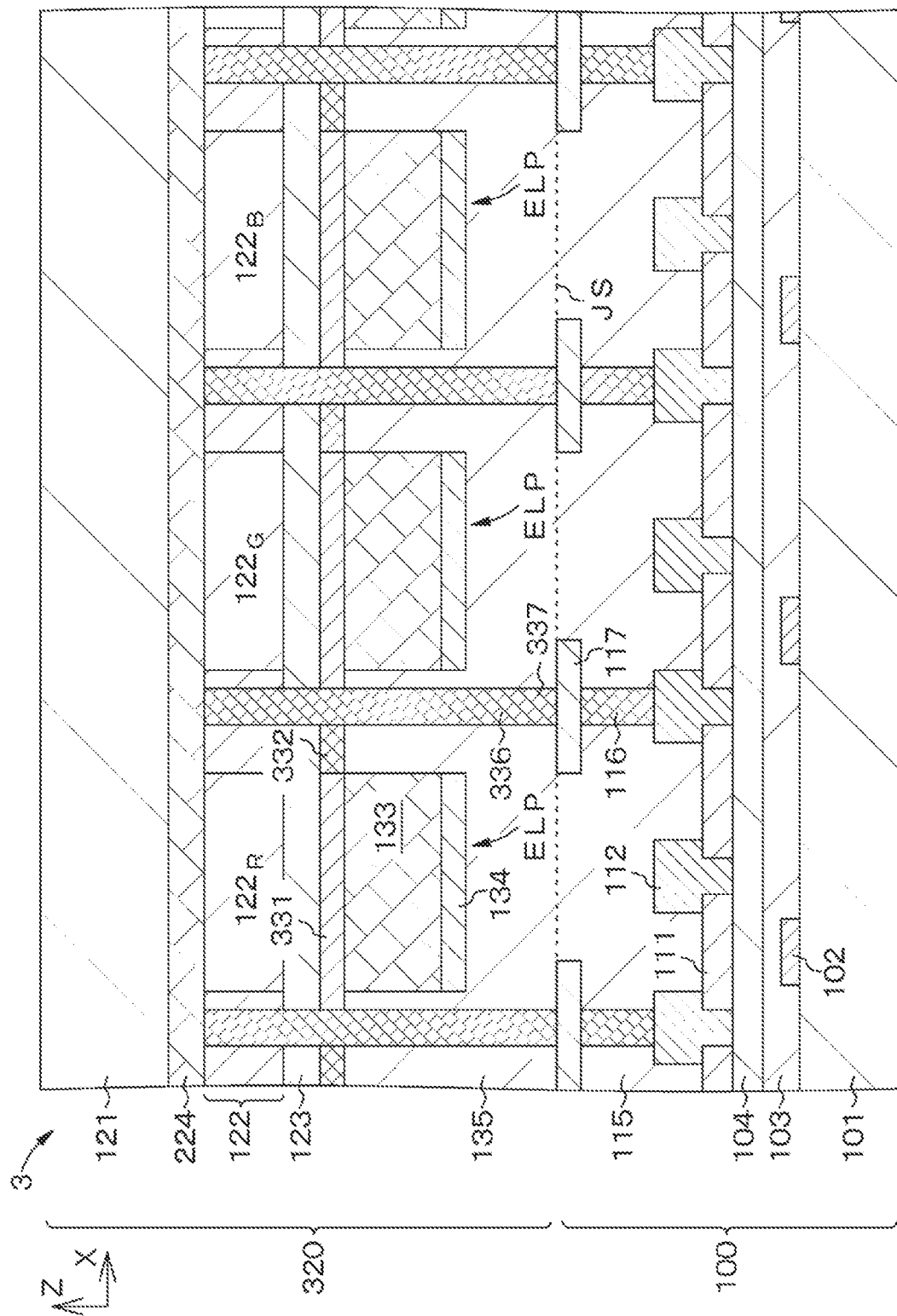
FIG. 20 is a schematic partial cross-sectional view of a display device according to a second variation of the first embodiment.

FIG. 20 is a schematic partial cross-sectional view of a display device according to a second variation of the first embodiment. The schematic plan view for illustrating the display device according to the second variation may be provided by replacing the display device 1 in FIG. 1 with a display device 3.

In the display device 1 illustrated in FIG. 3, the contact plugs 136 are formed in contact with the bottom surfaces of the upper electrodes 131. In the display device 3 illustrated in FIG. 20, by contrast, contact plugs 336 are formed in contact with side surfaces of upper electrodes 331. This is a main difference from the display device 1.

Figure 21A:
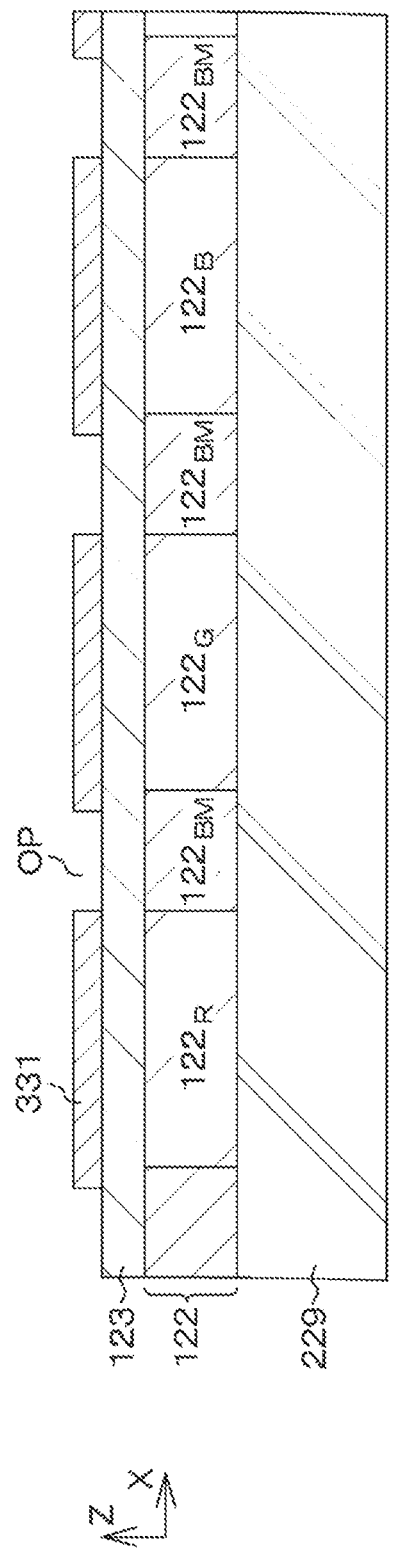
FIG. 21A is a schematic partial cross-sectional view of a base material and other elements for illustrating a method for fabricating the display device according to the second variation of the first embodiment.
Figure 22:
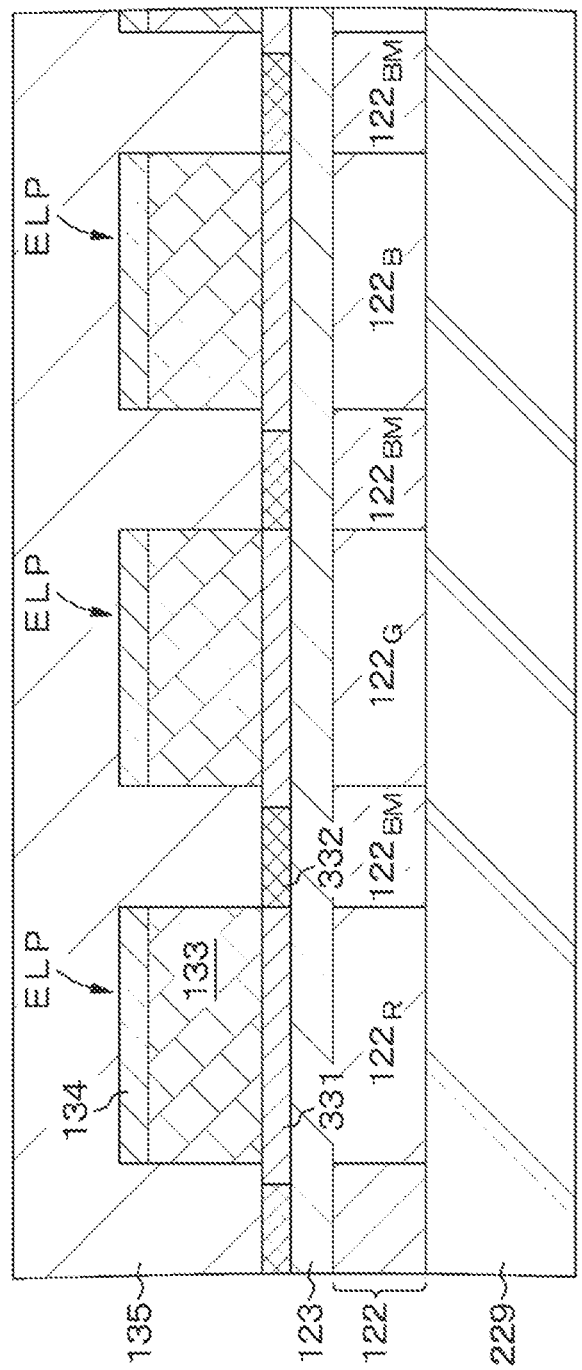
FIG. 22, which follows
Figure 23:
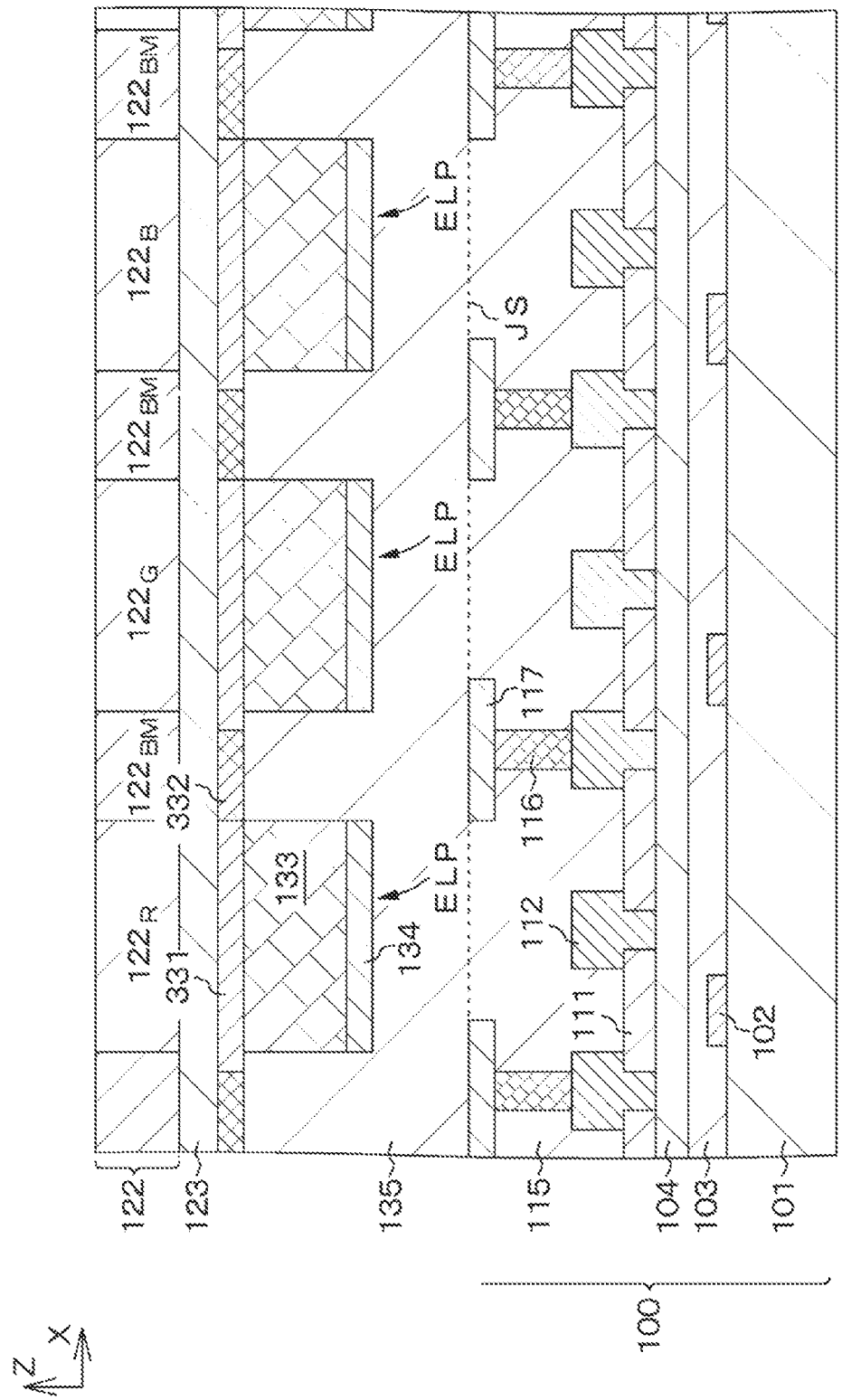
FIG. 23, which follows

FIGS. 21 to 23 are schematic partial cross-sectional views of a base material and other elements for illustrating a method for fabricating the display device according to the second variation.

The following describes, in detail, the method for fabricating the display device 3 by referring to these drawings.

[Step 300]

First, a step similar to step 100 described above with respect to the first embodiment is performed to provide the lower substrate 100 illustrated in FIG. 3.

[Step 310] (See FIGS. 21A, 21B, 22, and 23.)

Next, a base material 229 formed from, for example, silicon is prepared, and a step similar to step 110 described above with respect to the first embodiment is performed on the base material 229, not the base material 121. FIG. 21A corresponds to FIG. 10A in step 110. FIG. 21B corresponds to FIG. 10B in step 110. Upper electrodes 331 have a smaller outer shape than the upper electrodes 131 of the display device 1, so that side surfaces of the upper electrodes 331 can be connected to contact plugs 336 (described hereinafter).

Thereafter, organic layers for forming light emitting units 133 and a conductive film formed from, for example, aluminum (Al) and intended to form a lower electrode 134 are sequentially stacked on the entire surface, including the upper electrodes 331 which constitute anode electrodes. These films are preferably stacked through an integrated process in a vacuum state. Next, the organic layers and the conductive film can be processed by using, for example, a dry etching method, thereby providing light emitting elements ELP formed to correspond to individual pixels. Thereafter, a planarization film 135 is formed on the entire surface, including the light emitting elements ELP (see FIG. 22).

Figure 24:
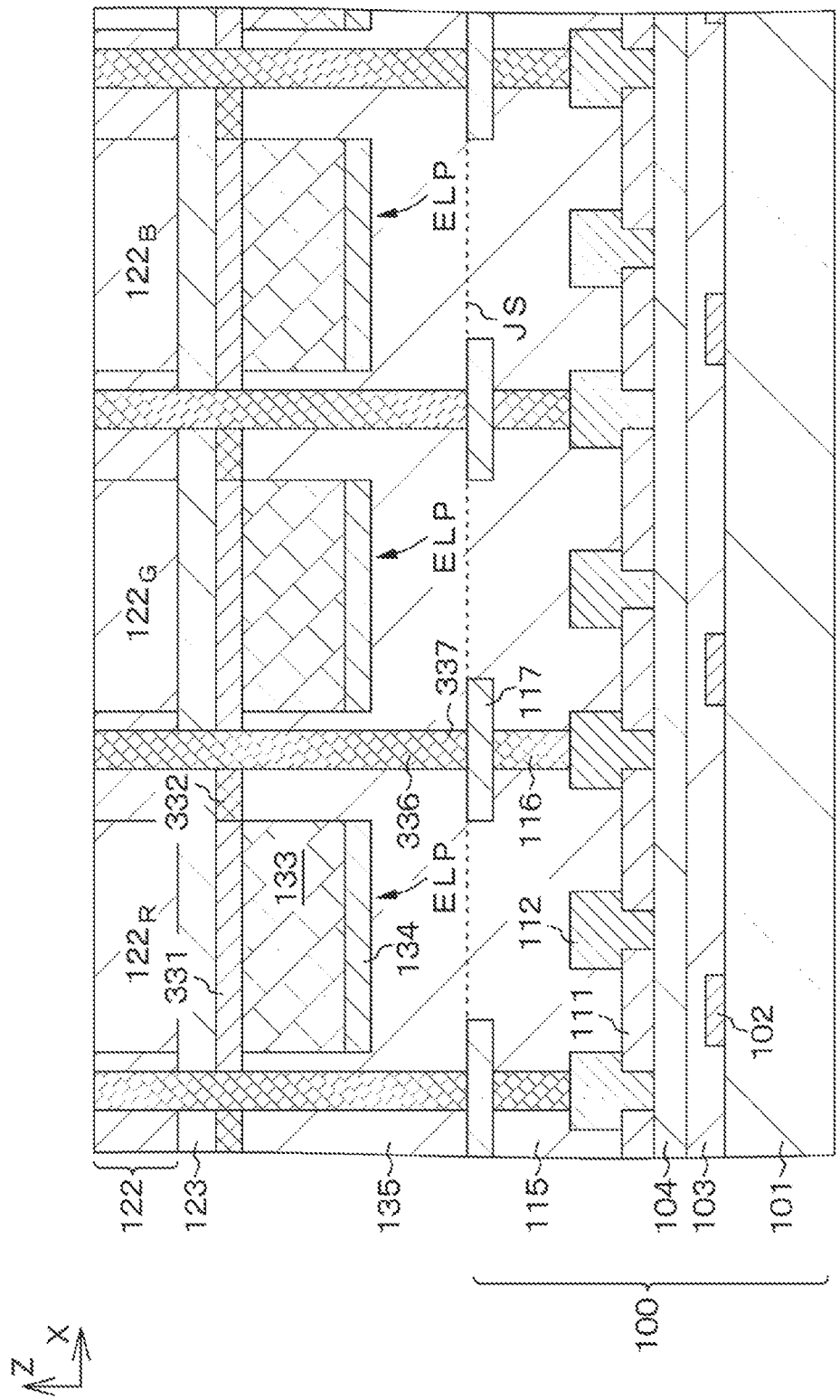
FIG. 24, which follows

[Step 320] (See FIGS. 23 and 24.)

Then, a step similar to step 120 described above with respect to the first embodiment is performed such that a connection surface JS of the lower substrate 100 and a connection surface JS of the planarization film 135 formed on the base material 229 side face each other, and under this condition, joining is performed at room temperature in vacuum. Thereafter, the base material 229 is removed (see FIG. 23).

Next, contact holes are formed to penetrate color filters 122, a protective film 123, and the planarization film 135, and contact plugs 336 are formed that reach second connection parts 117 and include side walls in contact with the upper electrodes 331 (see FIG. 24). In this configuration, leading end portions of the contact plugs 336 facing the second connection parts 117 constitute first connection parts 337. Thereafter, a base material 121 is laminated onto the color filters 122 using a sealing resin 224. The display device 3 illustrated in FIG. 20 can be provided through this step.

[Third Variation]

Figure 25:
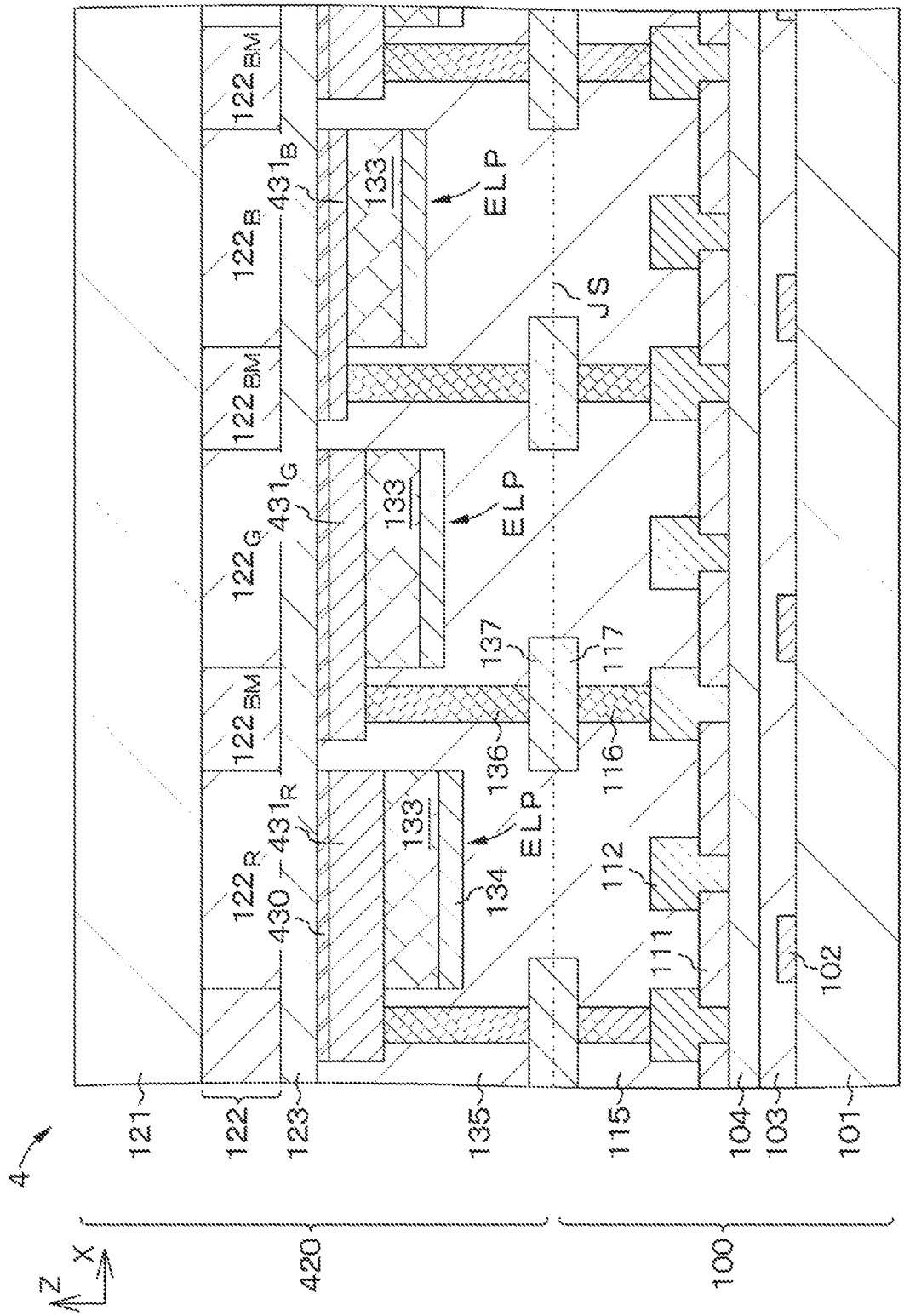
FIG. 25 is a schematic partial cross-sectional view of a display device according to a third variation of the first embodiment.

FIG. 25 is a schematic partial cross-sectional view of a display device according to a third variation of the first embodiment. The schematic plan view for illustrating the display device according to the third variation may be provided by replacing the display device 1 in FIG. 1 with a display device 4.

In the display device 4 illustrated in FIG. 25, the light emitting elements ELP have a resonator structure for resonating light generated by the light emitting units. This is a main difference from the display device 1.

In the display device 4, a semi-transmissive reflection film 430 is disposed between the protective film 123 and upper electrodes 431. For example, the semi-transmissive reflection film 430 may be formed from a thin film of silver (Ag). The thickness of the upper electrodes 431 is set, as appropriate, according to the wavelength of a color to be emitted by the light emitting elements ELP. A microcavity structure is formed between the semi-transmissive reflection film 430 and the lower electrode 134.

The display device 4 is configured such that: the semi-transmissive reflection film 430 is provided in an upper substrate 420; and upper electrodes $431_R$, $431_G$, and $431_B$, which have a thickness that is set according to a color to be displayed, are formed, rather than the upper electrodes 131 illustrated in FIG. 3. The noted display device has these differences and can be fabricated through fabrication steps essentially similar to those described for the display device 1.

(Fourth Variation)

FIG. 25 is a schematic partial cross-sectional view of a display device according to a fourth variation of the first embodiment. The schematic plan view for illustrating the display device according to the third variation may be provided by replacing the display device 1 in FIG. 1 with a display device 5.

Figure 26:
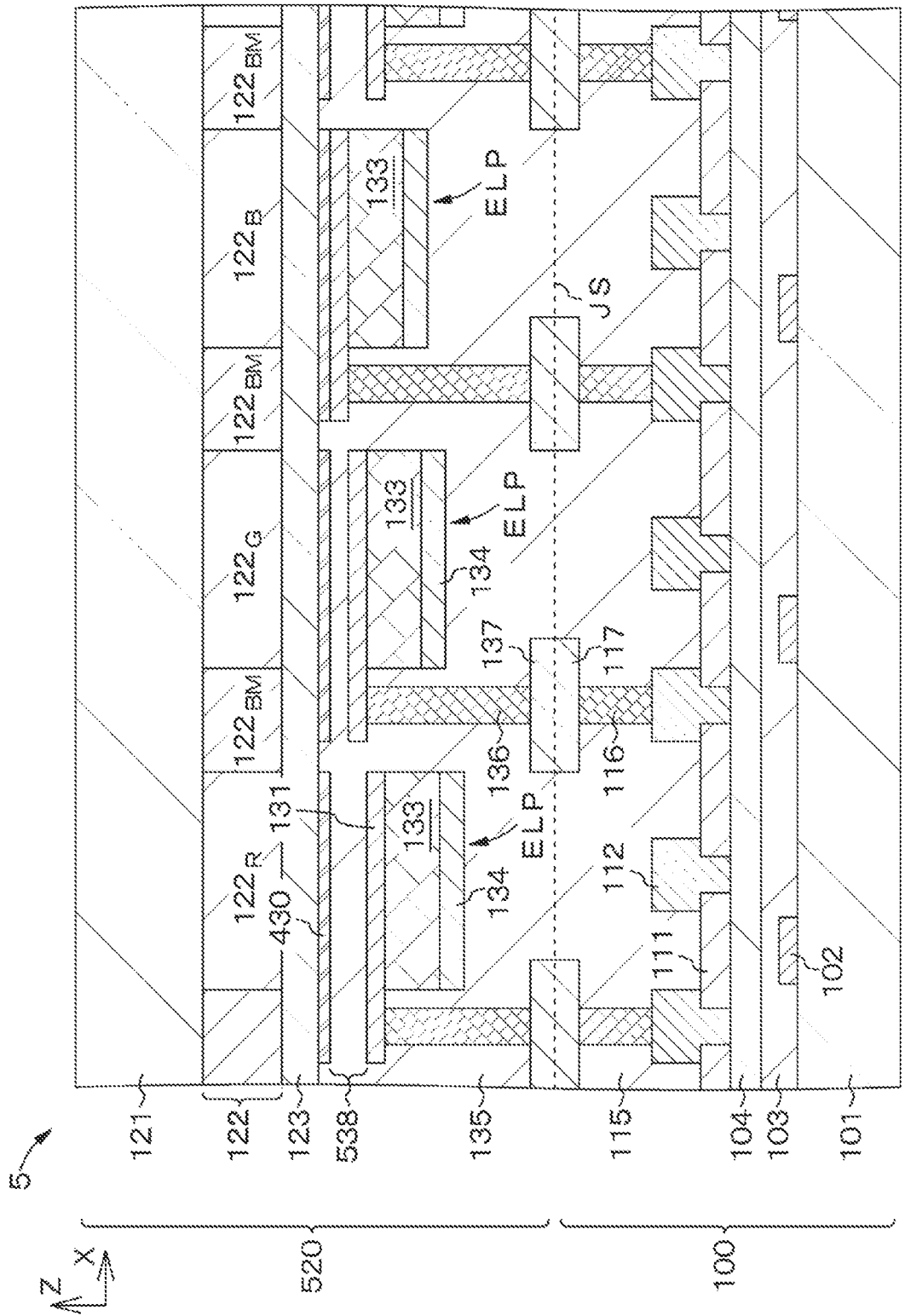
FIG. 26 is a schematic partial cross-sectional view of a display device according to a fourth variation of the first embodiment.

In the display device 5 illustrated in FIG. 26, the light emitting elements ELP have a resonator structure for resonating light generated by the light emitting units. This is a main difference from the display device 1.

As in the third variation, the display device 5 also has the semi-transmissive reflection film 430 disposed on the protective film 123. However, an insulating film 538 is provided between the first electrodes 131 and the semi-transmissive reflection film 430. The thickness of the insulating film 538 is set according to a color to be emitted by the light emitting elements ELP. A microcavity structure is formed between the semi-transmissive reflection film 430 and the lower electrode 134.

The display device 5 is different in that the semi-transmissive reflection film 430 is provided in an upper substrate 520 and that the insulating film 538 having a thickness that is set according to a color to be emitted by the light emitting elements ELP is formed. This display device can be fabricated through fabrication steps essentially similar to those described for the display device 1.

(Fifth Variation)

Figure 27:
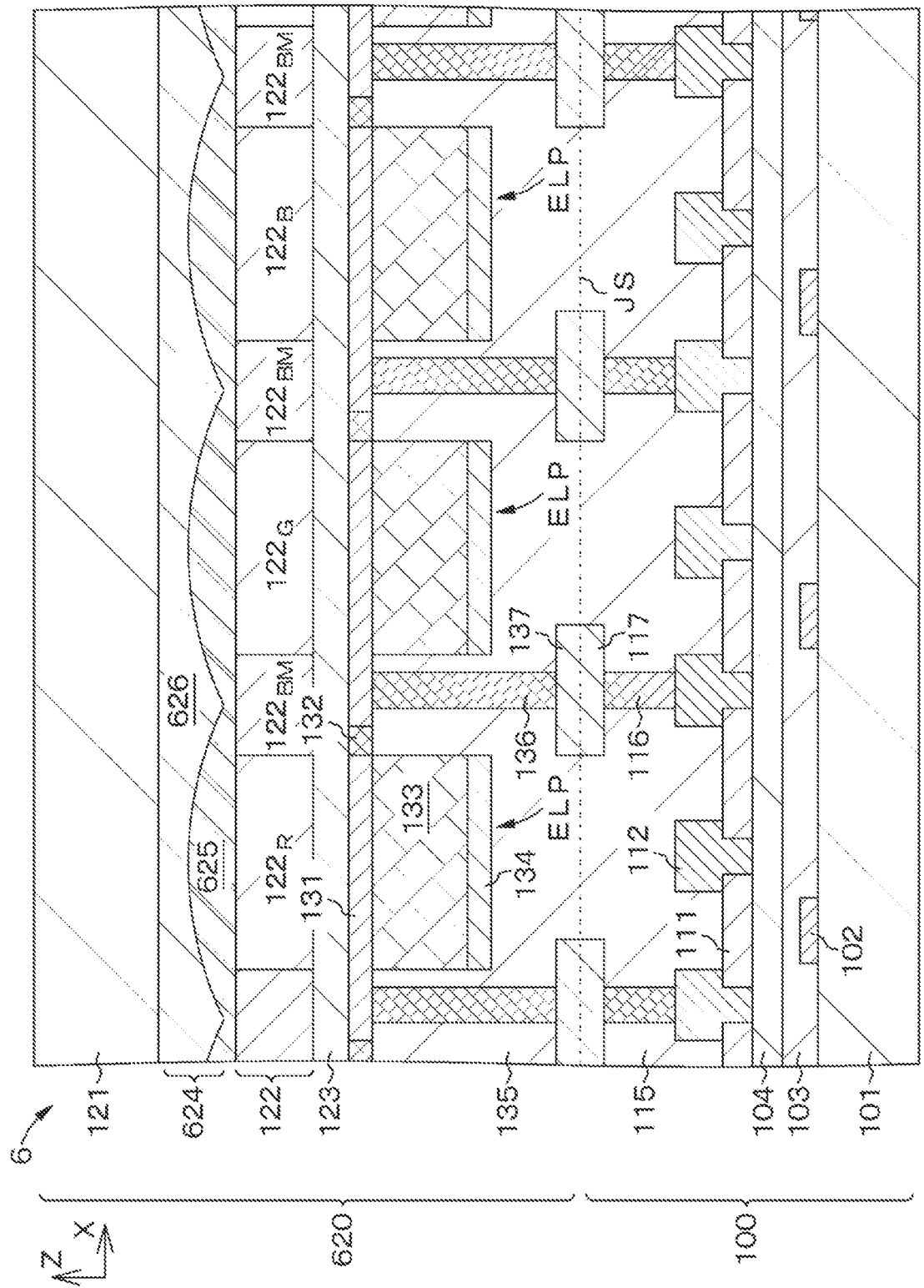
FIG. 27 is a schematic partial cross-sectional view of a display device according to a fifth variation of the first embodiment.

FIG. 27 is a schematic partial cross-sectional view of a display device according to a fifth variation of the first embodiment. The schematic plan view for illustrating the display device according to the fifth variation may be provided by replacing the display device 1 in FIG. 1 with a display device 6.

In the display device 5 illustrated in FIG. 27, condensing lenses 625 provided to correspond to the respective light emitting elements ELP are formed in an upper substrate 620. Reference sign 626 denotes a transparent material filling a space between the base material 121 and the condensing lenses 625. Reference sign 624 denotes a lens layer portion formed from the condensing lenses 625 and the transparent material 626. The condensing lenses 625 may be formed using a well-known method, as appropriate, before the upper electrodes 131 are formed.

Second Embodiment

The second embodiment also pertains to a display device, a method for fabricating the display device, and an electronic instrument according to the present disclosure.

Figure 28:
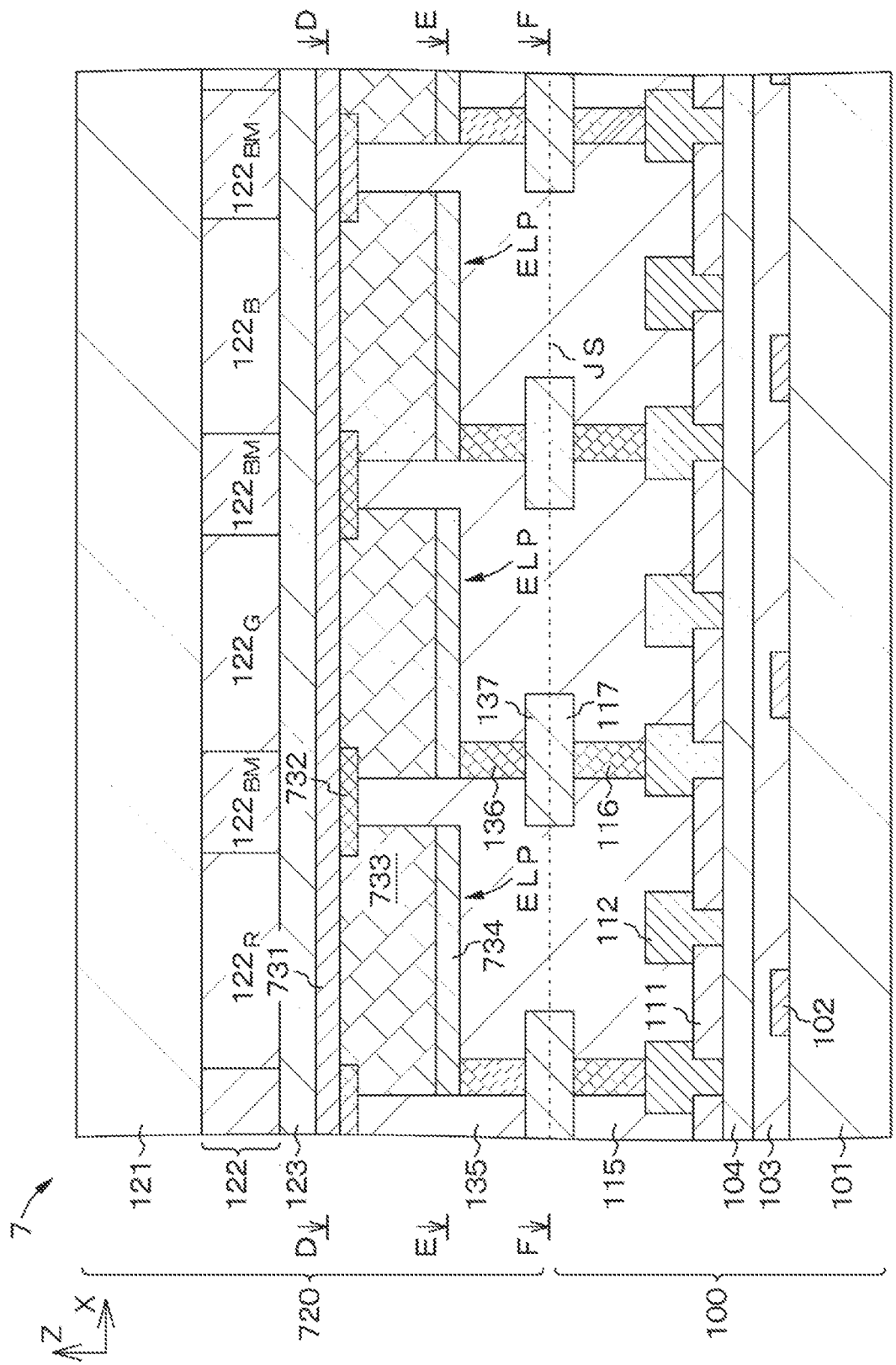
FIG. 28 is a schematic partial cross-sectional view of a display device according to a second embodiment.

FIG. 28 is a schematic partial cross-sectional view of the display device according to the second embodiment. The schematic plan view for illustrating the display device according to the second embodiment may be provided by replacing the display device 1 in FIG. 1 with a display device 7.

In the display device 1 according to the first embodiment, the upper electrodes are formed to correspond to the respective light emitting elements, and the lower electrode is formed as an electrode shared by each of the light emitting elements ELP. In the display device 7 according to the second embodiment, by contrast, an upper electrode is formed as an electrode shared by each of the light emitting elements, and lower electrodes are formed to correspond to the respective light emitting elements. This is a main difference from the display device 1.

Figure 32A:
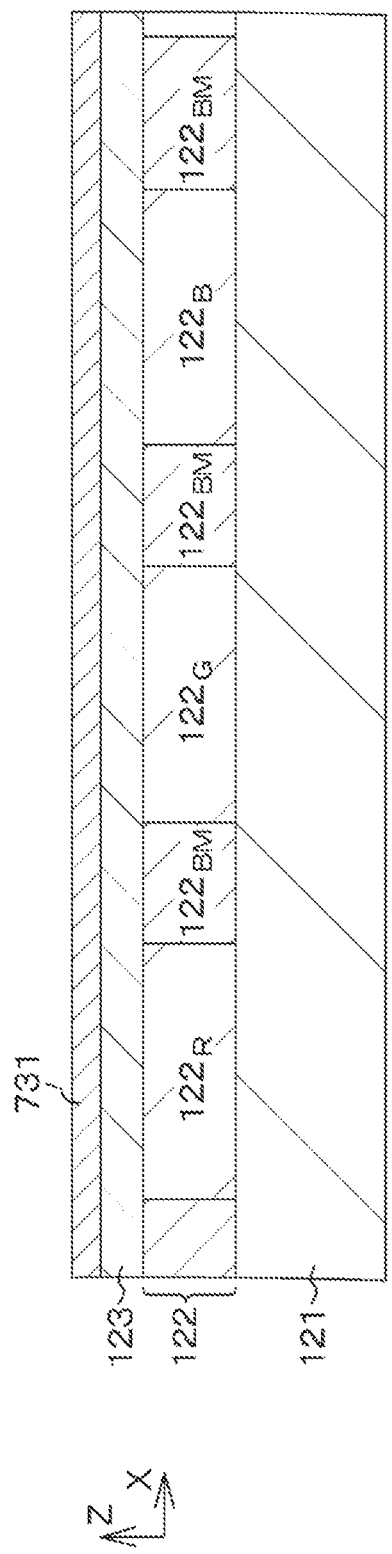
FIG. 32A is a schematic partial cross-sectional view of a base material and other elements for illustrating a method for fabricating the display device according to the second embodiment.
Figure 32B:
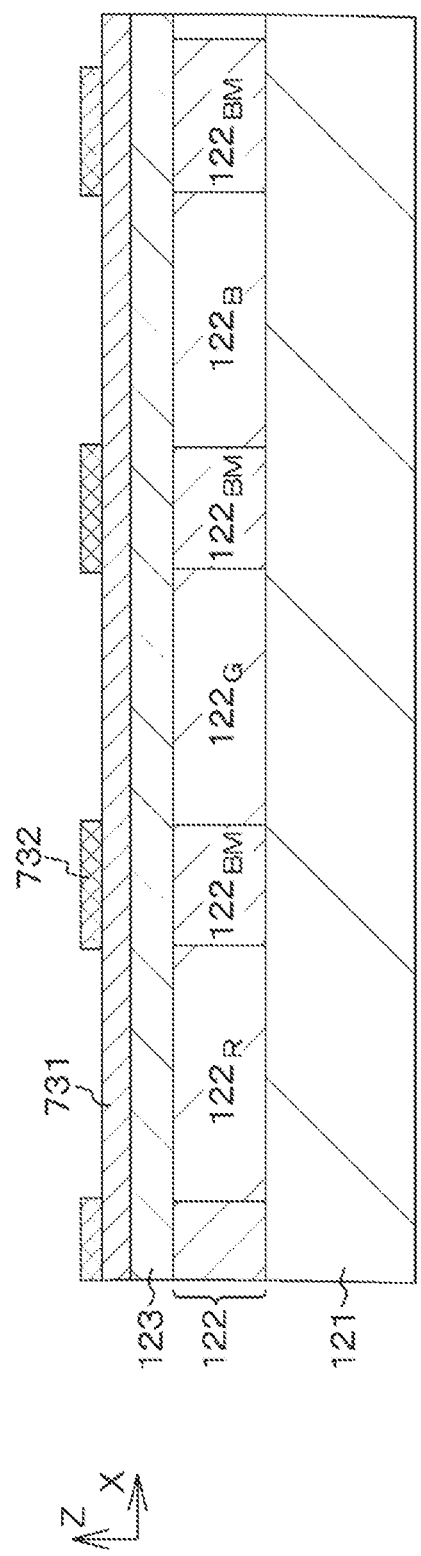
FIG. 32B is a schematic partial cross-sectional view of the base material and other elements for illustrating the method for fabricating the display device according to the second embodiment.

The display device 7 is formed such that pixels that include light emitting elements ELP formed by stacking an upper electrode 731, light emitting units 733, and lower electrodes 734 are arranged in a two-dimensional matrix. As will be described hereinafter in detail later with reference to FIGS. 32 and 33, the light emitting elements ELP are each formed by forming the upper electrode 731, which is light-transmissive, and then sequentially stacking, onto the upper electrode 731, a light emitting unit 733 and a lower electrode 734 formed from a metal material. The upper electrode 731 is formed as an electrode shared by each of the light emitting elements. The lower electrodes 734 are formed to correspond to the respective light emitting elements. Reference sign 732 denotes an insulating film for forming partitions between the light emitting units 733 of the pixels. The lower electrodes 734 and first connection parts 137 are connected via contact plugs 136.

The upper electrode 731 is typically formed using, for example, a sputtering method. In the present disclosure, the light emitting units 733 are stacked after the upper electrode 731 is formed. Thus, the light emitting units 733 are not damaged in the process of forming the upper electrode 731. Accordingly, since damage to the light emitting units can be reduced, the luminance of the display device can be increased.

Forming the upper electrode 731 does not damage the light emitting units 733. Hence, an increase in the voltage of the elements can be suppressed, and it can be ensured that the upper electrode 731 has a sufficient thickness. The upper electrode, which is shared by each of the light emitting elements ELP, can be formed on the entire surface from a low-resistance continuous film, so that the potential of the lower electrodes can be suppressed from changing according to the positions of the pixels, without adding, for example, auxiliary electrode wiring. Hence, the display screen of the display device 7 can also have improved uniformity.

Figure 29:
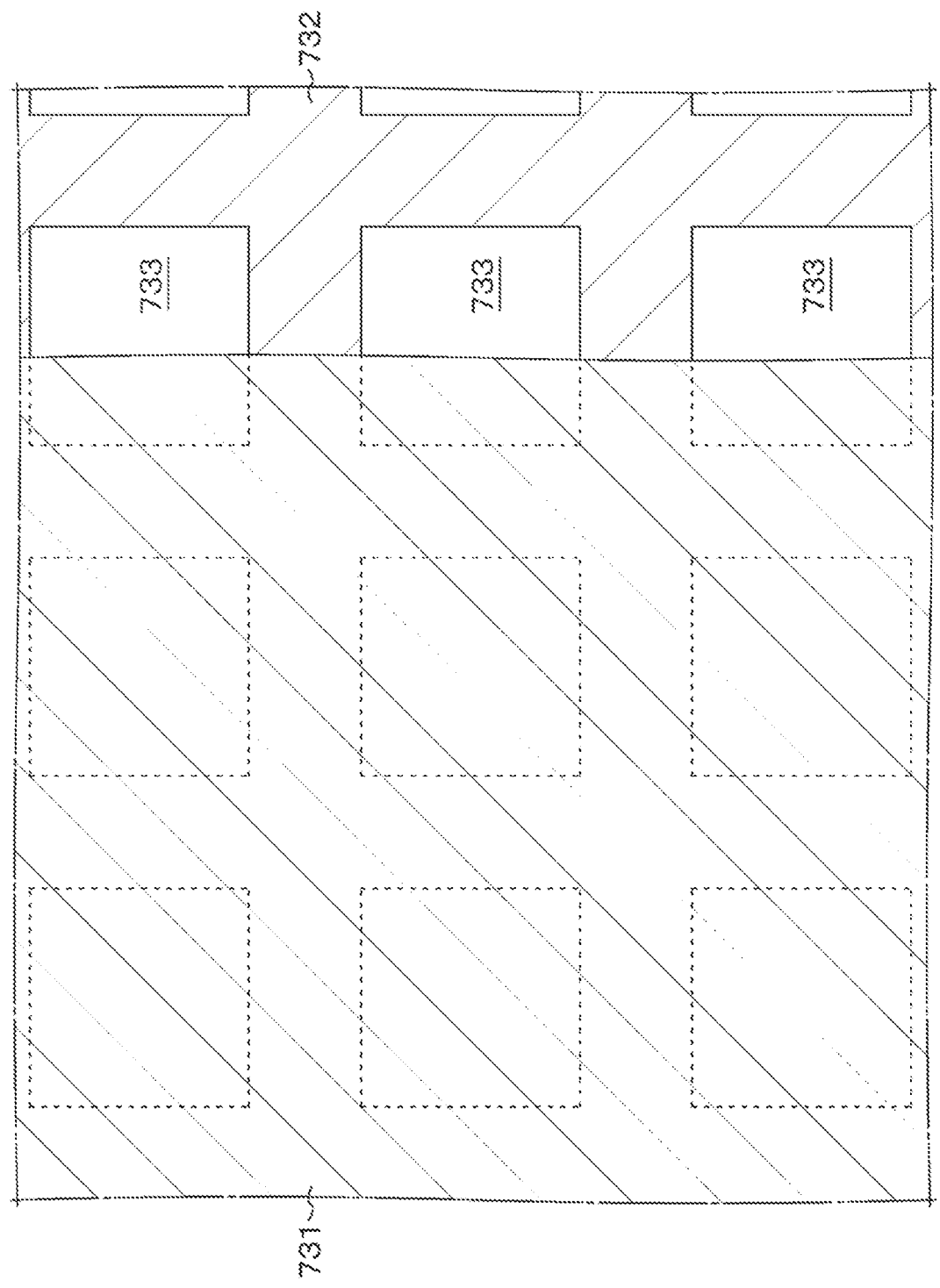
FIG. 29 is a schematic cross-sectional view of a portion indicated by D-D in FIG. 28.
Figure 30:
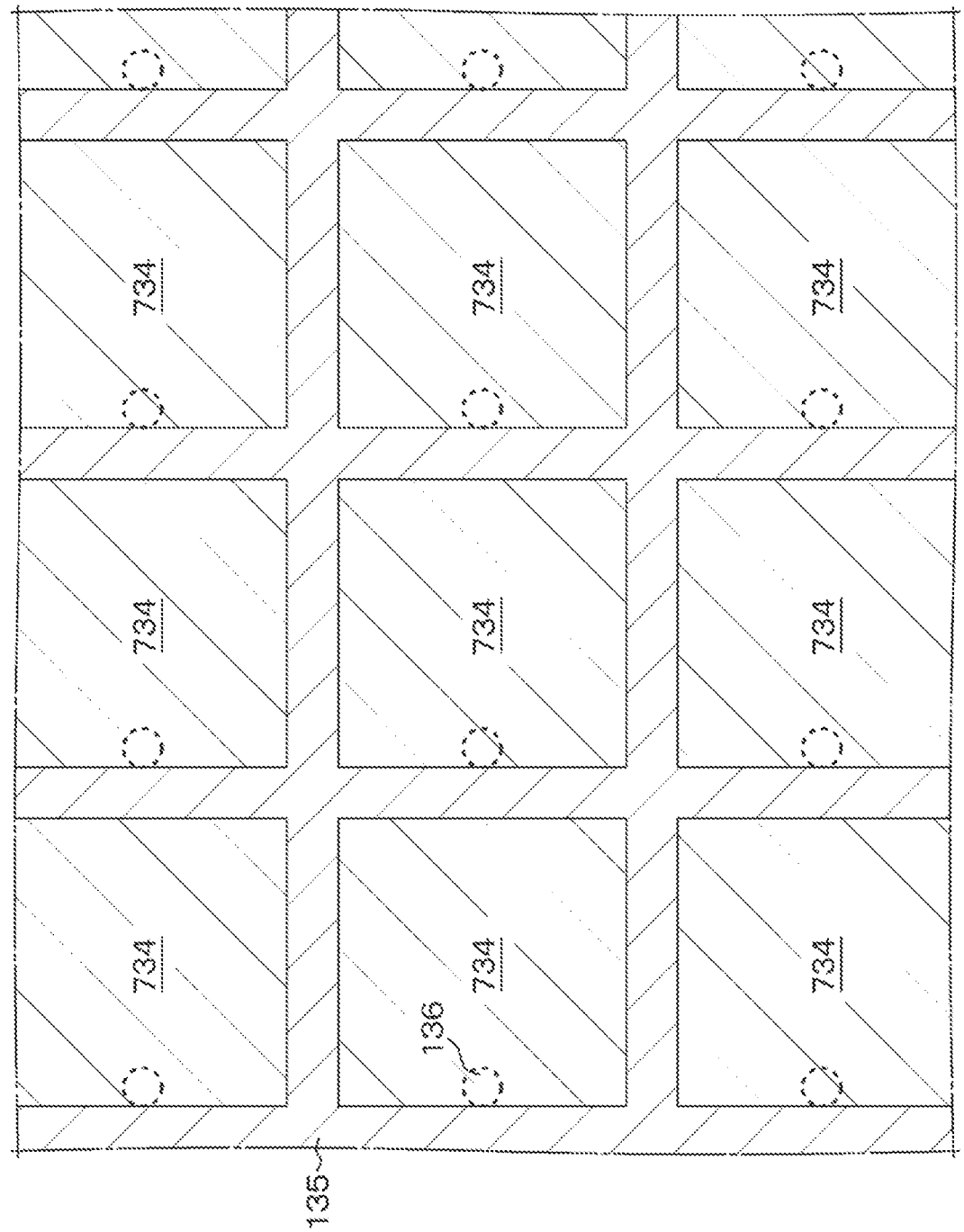
FIG. 30 is a schematic cross-sectional view of a portion indicated by E-E in FIG. 28.

Next, descriptions are given of a planar positioning relationship between the upper electrode 731, the lower electrodes 734, and the connection parts 117 and 137. FIG. 29 is a schematic cross-sectional view of a portion indicated by D-D in FIG. 28. Note that, in order to help understanding, a portion of the upper electrode 731 is indicated in a cut-out manner in this figure. FIG. 30 is a schematic cross-sectional view of a portion indicated by E-E in FIG. 28. FIG. 31 is a schematic cross-sectional view of a portion indicated by F-F in FIG. 28.

As illustrated in FIG. 29, the upper electrode 731 is formed as an electrode shared by each of the light emitting elements ELP, and the insulating film 732 for forming partitions between the light emitting units 733 is provided in a lattice shape. As illustrated in FIG. 30, the lower electrodes 734 are formed for the respective light emitting elements ELP. The contact plugs 136 are formed in contact with the bottom surfaces of the lower electrodes 734. Note that the positioning of the connection parts 117 and 137 in FIG. 28 is similar to that in FIG. 6 in the first embodiment.

As with the light emitting units 133 in the first embodiment, the light emitting units 733 are formed from organic layers including light emitting layers. However, the light emitting units 733 are each formed such that a hole injection layer is located on the lower electrode 734 side and an electron injection layer is located on the upper electrode 731 side. The stacking structure of the organic layers 733 may be understood by respectively replacing reference sign 133, the upper electrodes 131, and the lower electrode 134 in FIGS. 7A, 7B, 8A, 8B, and 8C with reference sign 733, the lower electrodes 734, and the upper electrode 731, and descriptions of this structure are omitted herein.

FIGS. 32 to 36 are schematic partial cross-sectional views of a base material and other elements for illustrating the method for fabricating the display device according to the second embodiment.

The following describes, in detail, the method for fabricating the display device 7 by referring to these drawings.

[Step 700]

First, a step similar to step 100 described above with respect to the first embodiment is performed to provide the lower substrate 100 illustrated in FIG. 3.

[Step 710] (See FIGS. 32A, 32B, 33, 34, and 35.)

Next, an upper substrate 720 is produced in which light emitting elements ELP are formed. A base material 121 is prepared, and a predetermined film-formation and patterning process is performed on the base material 121, thereby forming color filters 122. Subsequently, a protective film 123 is formed on the color filters 122. Afterward, ITO is formed on the entirety of the surface of the protective film 123 by using, for example, a sputtering method, so as to form an upper electrode 731 (see FIG. 32A). Thereafter, an inorganic insulating film such as a silicon oxynitride is formed by using, for example, a sputtering method or a CVD method, and is then patterned, as appropriate, thereby forming an insulating film 732 (see FIG. 32B) for forming partitions between light emitting units 733.

Thereafter, organic layers for forming the light emitting units 733 and a conductive film formed from, for example, aluminum (Al) and intended to form lower electrodes 734 are sequentially stacked on the entire surface, including the upper electrode 731 which constitutes a cathode electrode. These films are preferably stacked through an integrated process in a vacuum state.

The organic layers for forming the light emitting units 733 and the conductive film formed from a metal material are sequentially stacked, so that a decrease in a reflectance caused by surface oxidation of the lower electrodes 734 can be suppressed. In addition, a low electrical barrier can be maintained between the lower electrodes 734 and the organic layers, so that the voltage of the light emitting elements ELP can also be reduced.

Figure 33:
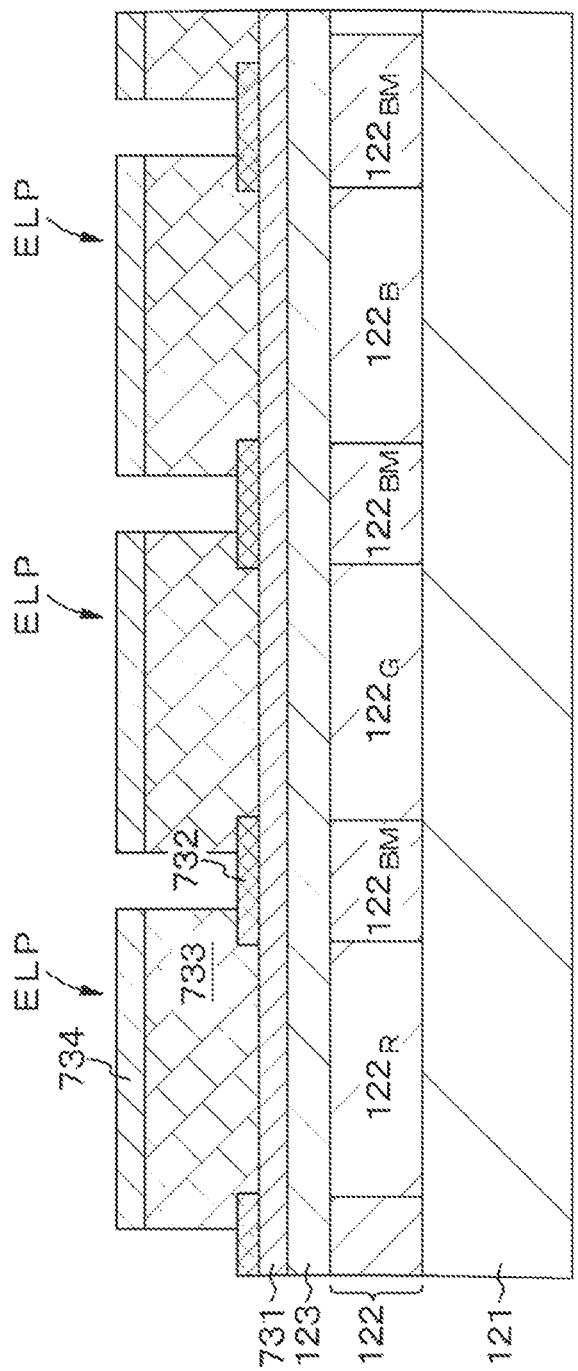
FIG. 33, which follows
Figure 34:
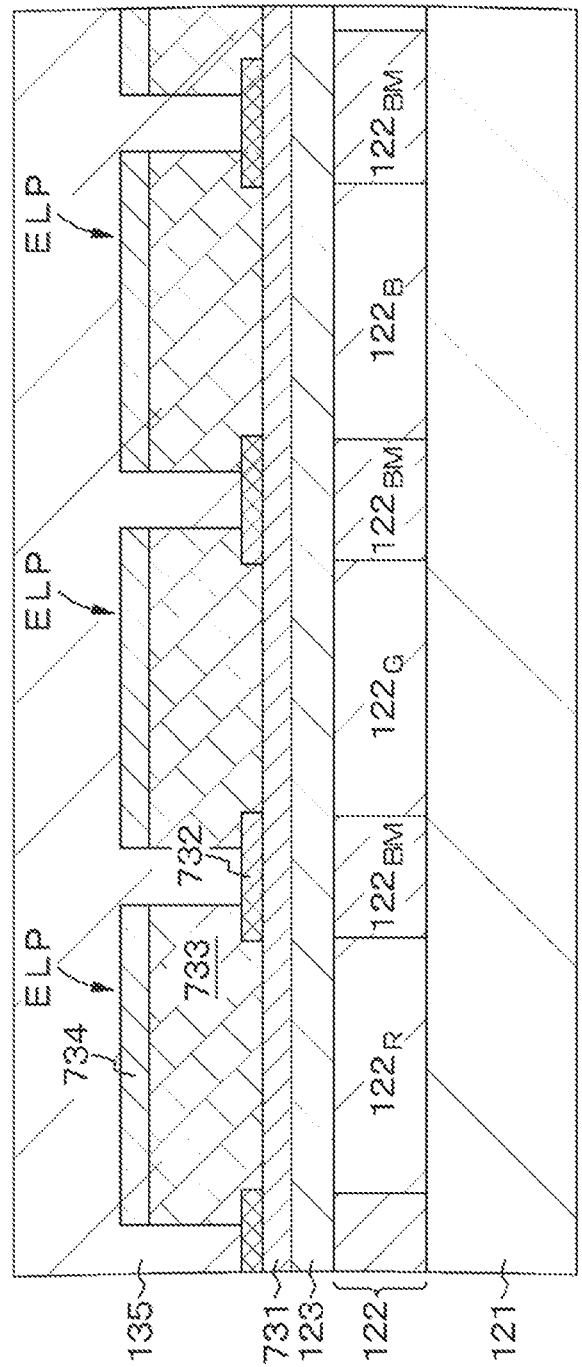
FIG. 34, which follows
Figure 35:
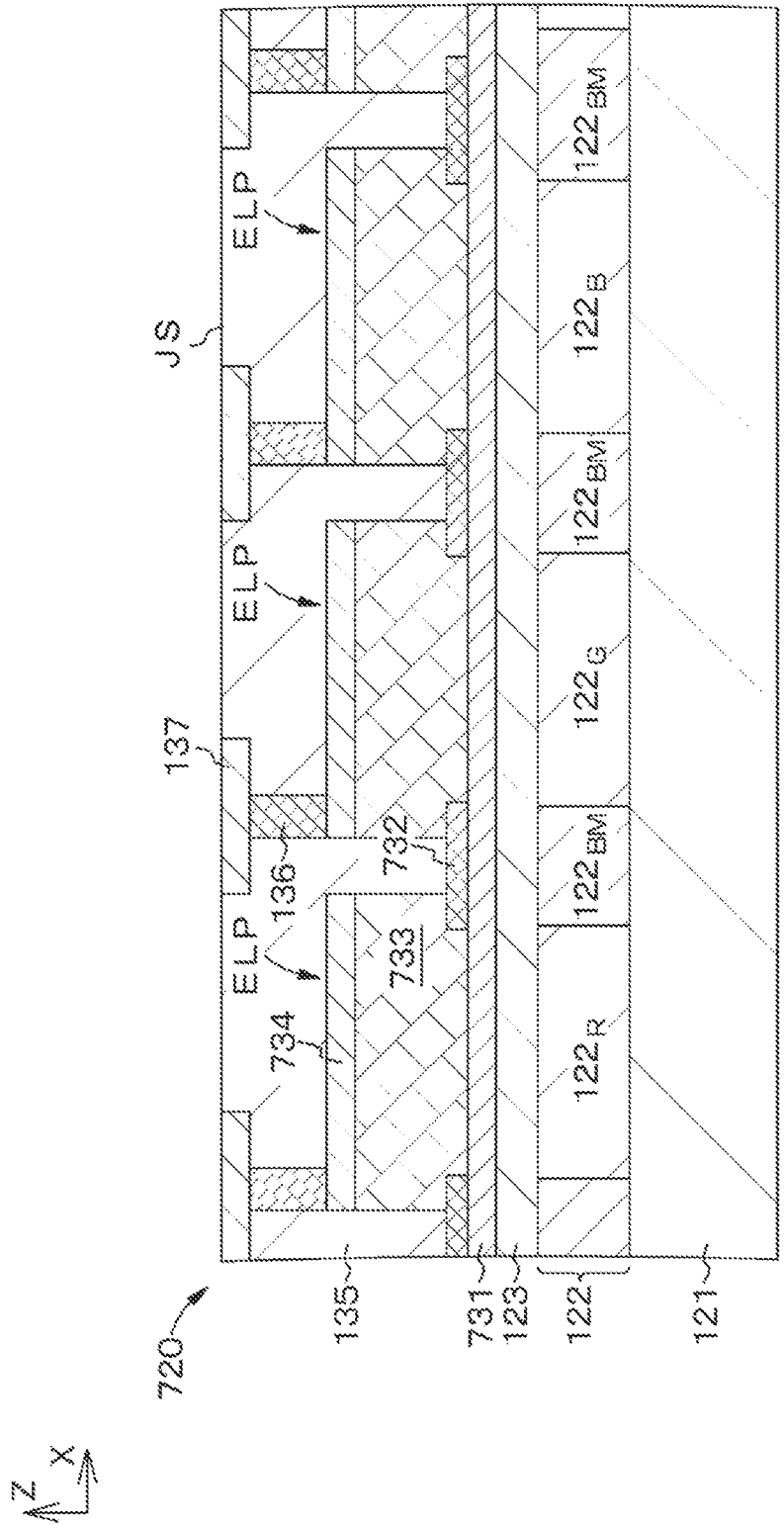
FIG. 35, which follows
Figure 36:
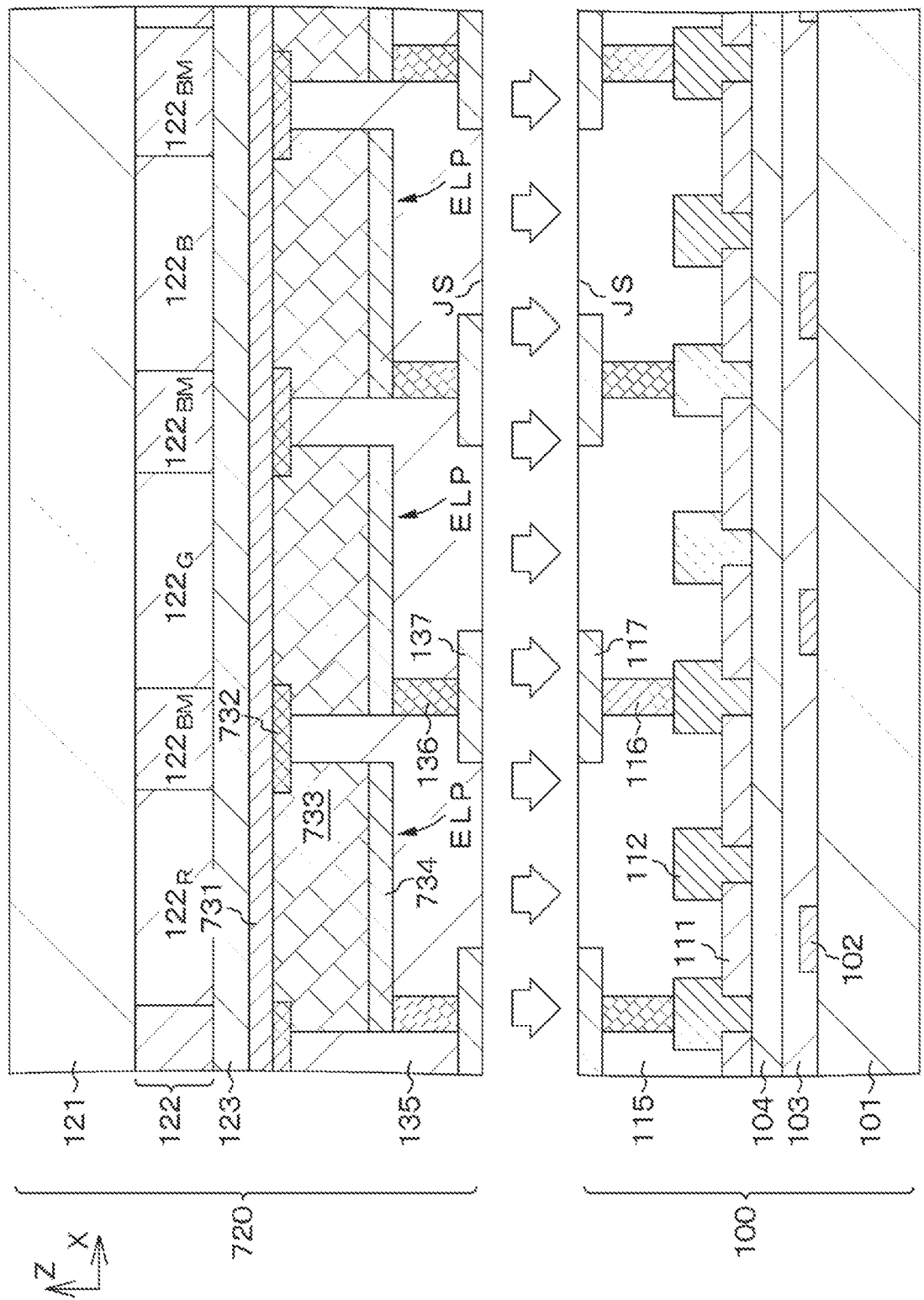
FIG. 36, which follows

Next, the organic layers and the conductive film can be processed by using, for example, a dry etching method, thereby providing light emitting elements ELP formed to correspond to the respective pixels (see FIG. 33). Subsequently, a planarization film 135 is formed on the entire surface, including the light emitting elements ELP (see FIG. 34). Then, contact holes are formed in the planarization film 135, and contact plugs 136 and first connection parts 137 are formed in the openings (see FIG. 35). The upper substrate 720 illustrated in FIG. 28 can be provided through this step. [Step 720] (See FIG. 36.)

Thereafter, connection surfaces JS where the first connection parts 137 and the second connection parts 117 are exposed are irradiated with, for example, Ar plasma so as to activate the connection surfaces JS. Then, the upper substrate 720 and the lower substrate 100 are caused to face each other such that the first connection parts 137 and the second connection parts 117 face each other, and under this condition, joining is performed at room temperature in vacuum. The display device 7 illustrated in FIG. 28 can be provided through this step.

In the described display device of the present disclosure, the light emitting elements are each formed by forming a light-transmissive upper electrode and then sequentially stacking a light emitting unit and a lower electrode formed from a metal material onto the upper electrode. Thus, the light emitting units are not damaged in the process of forming the light-transmissive upper electrode. Hence, the luminance of the display device can be increased. Furthermore, the effects described in the present disclosure are illustrative and not restrictive, and additional effects may be provided.

[Descriptions of Electronic Instrument]

The described display device of the present disclosure can be used as a display unit (display device) for an electronic instrument belonging to any field, so as to display, as images or video, video signals input to the electronic instrument or video signals generated within the electronic instrument. As an example, the display device can be used as a display unit for, for example, a television set, a digital still camera, a notebook personal computer, a mobile terminal device such as a mobile phone, a video camera, or a head mounted display (display of a head-mounted type).

The display device of the present disclosure includes one having a module shape with a sealed configuration. As an example, a display module formed by laminating a facing part such as transparent glass on a pixel array unit may be applicable. Note that the display module may be provided with, for example, a circuit unit or a flexible printed circuit (FPC) for inputting a signal or the like from the outside to the pixel array unit or outputting the same from the pixel array unit to the outside. Hereinafter, a digital still camera and a head mounted display will be presented as specific examples of an electronic instrument using the display device of the present disclosure. However, the specific examples presented in the following are merely some examples of the present invention, which is not limited thereto.

First Specific Example

Figure 37A:
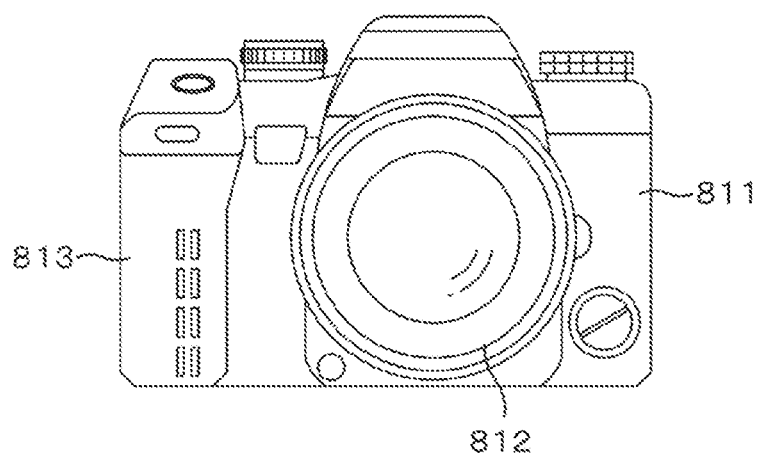
FIG. 37A is a front view of a single-lens reflex digital still camera of a lens-interchangeable type.
Figure 37B:
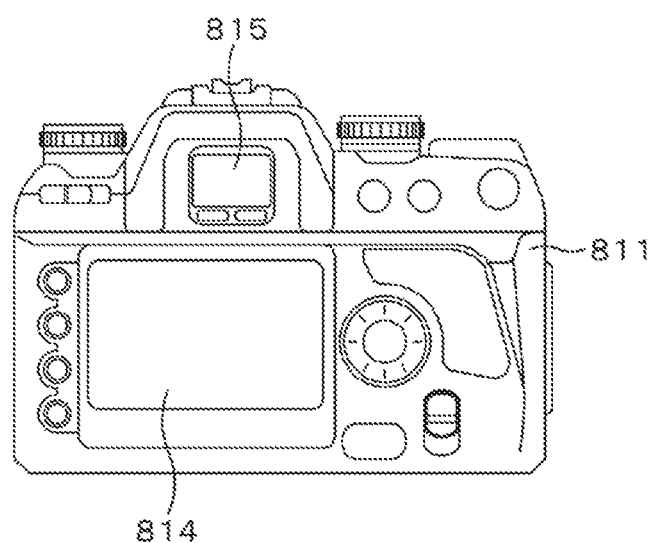
FIG. 37B is a back view of a single-lens reflex digital still camera of a lens-interchangeable type.

FIG. 37 constitutes appearance views of a single-lens reflex digital still camera of a lens-interchangeable type, FIG. 37A indicates a front view thereof, and FIG. 37B indicates a back view thereof. For example, the single-lens reflex digital still camera of a lens-interchangeable type may include: an interchangeable imaging lens unit (interchangeable lens) 812 on the front-right side of a camera body unit (camera body) 811; and a grip part 813 to be held by a photographer on the front-left side of the camera body unit 811.

A monitor 814 is provided substantially at the center of the back surface of the camera body unit 811. A viewfinder (eyepiece window) 815 is provided above the monitor 814. By looking into the viewfinder 815, the photographer can view an optical image of a subject guided through the imaging lens unit 812 and determine a composition.

The display device of the present disclosure can be used as the viewfinder 815 of the single-lens reflex digital still camera of a lens-interchangeable type that has the above configuration. Thus, the single-lens reflex digital still camera of a lens-interchangeable type in this example is produced, with the display device of the present disclosure used as the viewfinder 815.

Second Specific Example

Figure 38:
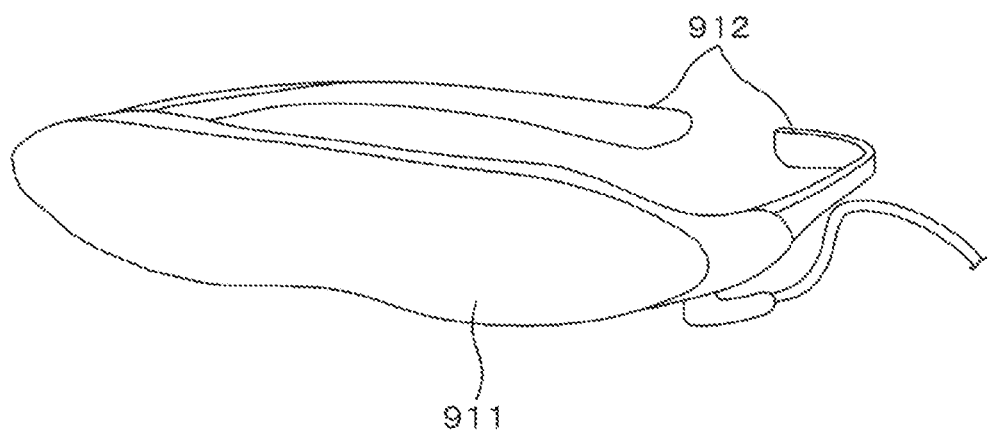
FIG. 38 is an appearance view of a head mounted display.

FIG. 38 is an appearance view of a head mounted display. For example, the head mounted display may include, on both sides of a display unit 511 shaped like glasses, ear-hook sections 912 to be mounted on the head of a user. The display device of the present disclosure may be used as the display unit 911 of the head mounted display. Thus, the head mounted display in this example is produced, with the display device of the present disclosure used as the display unit 911.

Third Specific Example

FIG. 39 is an appearance view of a see-through head mounted display. A see-through head mounted display 941 is formed from a body part 942, an arm 943, and a lens barrel 944.

The body part 942 is connected to the arm 943 and glasses 930. Specifically, an end portion of the body part 942 in a long side direction is coupled to the arm 943, and a side surface of the body part 942 on one side is coupled to the glasses 600 via a connecting member. Note that the body part 942 may be directly mounted on the head of the human body.

The body part 942 has installed therein a display unit and a control board for controlling operations of the see-through head mounted display 941. The arm 943 connects the body part 942 and the lens barrel 944 and supports the lens barrel 944. Specifically, the arm 943 is coupled to an end portion of the body part 942 and an end portion of the lens barrel 944, and fixes the lens barrel 944. The arm 943 also has installed therein a signal line for communicating data pertaining to an image provided from the body part 942 to the lens barrel 944.

The lens barrel 944 projects, through an eyepiece toward an eye of the user wearing the see-through head mounted display 941, image light provided thereto from the body part 942 via the arm 943. The display device of the present disclosure may be used for the display unit of the body part 942 of the see-through head mounted display 941.

Others

The technology of the present disclosure can also have the following configurations.

[A1]

A display device, wherein pixels each including a light emitting element formed by stacking an upper electrode, a light emitting unit, and a lower electrode are arranged in a two-dimensional matrix, and the light emitting elements are formed by forming the upper electrodes which are light-transmissive, and then sequentially stacking, onto the upper electrodes, the light emitting units and the lower electrode which is formed from a metal material.

[A2]

The display device according to [A1], in which the light emitting units are formed from organic layers including light emitting layers.

[A3]

The display device according to [A1] or [A2], wherein the display device is configured such that a joining surface of a lower substrate in which a drive circuit that drives the light emitting elements is formed is joined to a joining surface that an upper substrate in which the light emitting elements are formed has on a lower-electrode side.

[A4]

The display device according to [A3], wherein the upper substrate includes first connection parts disposed on the joining surface on the lower-electrode side so as to correspond to the respective light emitting elements, and the lower substrate includes second connection parts disposed on the joining surface of the lower substrate so as to correspond to the first connection parts.

[A5]

The display device according to [A4], wherein the light emitting elements are electrically connected to the drive circuit that drives the light emitting elements, by joining the first connection parts to the second connection parts.

[A6]

The display device according to [A4], wherein the upper electrodes are formed individually to correspond to the respective light emitting elements, and the lower electrode is formed as an electrode shared by each of the light emitting elements.

[A7]

The display device according to [A6], wherein the upper electrodes and the first connection parts are connected via contact plugs passing through openings provided in the lower electrode.

[A8]

The display device according to [A7], wherein the contact plugs are formed to be connected to bottom surfaces or side surfaces of the upper electrodes.

[A9]

The display device according to any of [A6] to [A8], wherein the organic layers are each formed such that a hole injection layer is located on an upper-electrode side and an electron injection layer is located on the lower-electrode side.

[A10]

The display device according to [A4], wherein the upper electrode is formed as an electrode shared by each of the light emitting elements, and the lower electrodes are formed individually to correspond to the respective light emitting elements.

[A11]

The display device according to [A10], wherein the lower electrodes and the first connection parts are connected via contact plugs.

[A12]

The display device according to [A10] or [A11], wherein the organic layers are each formed such that a hole injection layer is located on the lower-electrode side and an electron injection layer is located on an upper-electrode side.

[A13]

The display device according to any of [A3] to [A12], wherein the organic layer of each of the light emitting elements is formed to emit white light.

[A14]

The display device according to any of [A3] to [A12], wherein the organic layer of each of the light emitting elements is formed to emit red light, green light, or blue light.

[A15]

The display device according to any of [A3] to [A14], wherein the light emitting elements include a resonator structure that resonates light generated by the light emitting units.

[A16]

The display device according to any of [A3] to [A15], wherein condensing lenses provided to correspond to the respective light emitting elements are formed in the upper substrate.

[B1]

A method for fabricating a display device in which pixels each including a light emitting element formed by stacking an upper electrode, a light emitting unit, and a lower electrode are arranged in a two-dimensional matrix, the method comprising:

a step of forming the light emitting elements by forming, on a base material, the upper electrodes which are light-transmissive, and then sequentially stacking, onto the upper electrodes, the light emitting units and the lower electrode which is formed from a metal material.

[B2]

The method for fabricating a display device according to [B1], in which the light emitting units are formed from organic layers including light emitting layers.

[B3]

The method for fabricating a display device according to [B2], in which the upper electrodes are formed to correspond to the respective light emitting elements, and the lower electrode is formed as an electrode shared by each of the light emitting elements.

[B4]

The method for fabricating a display device according to [B3], in which the organic layers are each formed such that a hole injection layer is located on an upper-electrode side and an electron injection layer is located on a lower-electrode side.

[B5]

The method for fabricating a display device according to [B2], in which the upper electrode is formed as an electrode shared by each of the light emitting elements, and the lower electrodes are formed to correspond to the respective light emitting elements.

[B6]

The method for fabricating a display device according to [B5], in which the organic layers are each formed such that a hole injection layer is located on a lower-electrode side and an electron injection layer is located on an upper-electrode side.

[B7]

The method for fabricating a display device according to any of [B2] to [B6], in which an organic layer that emits white light is formed in each of the light emitting elements.

[B8]

The method for fabricating a display device according to any of [B2] to [B7], in which an organic layer that emits red light, green light, or blue light is formed in each of the light emitting elements.

[C1]

An electronic instrument comprising: a display device, wherein pixels each including a light emitting element formed by stacking an upper electrode, a light emitting unit, and a lower electrode are arranged in a two-dimensional matrix, and the light emitting elements are formed by forming the upper electrodes which are light-transmissive, and then sequentially stacking, onto the upper electrodes, the light emitting units and the lower electrode which is formed from a metal material.

[C2]

The electronic instrument according to [C1], in which the light emitting units are formed from organic layers including light emitting layers.

[C3]

The electronic instrument according to [C1] or [C2], in which the display device is configured such that a joining surface of a lower substrate in which a drive circuit that drives the light emitting elements is formed is joined to a joining surface that an upper substrate in which the light emitting elements are formed has on a lower-electrode side.

[C4]

The electronic instrument according to [C3], in which the upper substrate includes first connection parts disposed on the joining surface on the lower-electrode side so as to correspond to the respective light emitting elements, and the lower substrate includes second connection parts disposed on the joining surface of the lower substrate so as to correspond to the first connection parts.

[C5]

The electronic instrument according to [C4], in which the light emitting elements are electrically connected to the drive circuit that drives the light emitting elements, by joining the first connection parts to the second connection parts.

[C6]

The electronic instrument according to [C4], in which the upper electrodes are formed to correspond to the respective light emitting elements, and the lower electrode is formed as an electrode shared by each of the light emitting elements.

[C7]

The electronic instrument according to [C6], in which the upper electrodes and the first connection parts are connected via contact plugs passing through openings provided in the lower electrode.

[C8]

The electronic instrument according to [C7], in which the contact plugs are formed to be connected to bottom surfaces or side surfaces of the upper electrodes.

[C9]

The electronic instrument according to any of [C6] to [C8], in which the organic layers are each formed such that a hole injection layer is located on an upper-electrode side and an electron injection layer is located on a lower-electrode side.

[C10]

The electronic instrument according to [C4], in which the upper electrode is formed as an electrode shared by each of the light emitting elements, and the lower electrodes are formed to correspond to the respective light emitting elements.

[C11]

The electronic instrument according to [C10], in which the lower electrodes and the first connection parts are connected via contact plugs.

[C12]

The electronic instrument according to [C10] or [C11], in which the organic layers are each formed such that a hole injection layer is located on a lower-electrode side and an electron injection layer is located on an upper-electrode side.

[C13]

The electronic instrument according to any of [C3] to [C12], in which the organic layer of each of the light emitting elements is formed to emit white light.

[C14]

The electronic instrument according to any of [C3] to [C12], in which the organic layer of each of the light emitting elements is formed to emit red light, green light, or blue light.

[C15]

The electronic instrument according to any of [C3] to [C14], in which the light emitting elements include a resonator structure that resonates light generated by the light emitting units.

[C16]

The electronic instrument according to any of [C3] to [C15], in which condensing lenses provided to correspond to the respective light emitting elements are formed in the upper substrate.

REFERENCE SIGNS LIST 1, 2, 3, 4, 5, 6, 7 DISPLAY DEVICE
11 HORIZONTAL DRIVE CIRCUIT
12 VERTICAL DRIVE CIRCUIT
100 LOWER SUBSTRATE
101 BASE MATERIAL
102 GATE ELECTRODE
103 GATE INSULATING FILM
104 SEMICONDUCTOR MATERIAL LAYER
111 INTERLAYER INSULATING FILM
112 SOURCE/DRAIN ELECTRODE
115 PLANARIZATION FILM
116 CONTACT PLUG
117 SECOND CONNECTION PART
120 UPPER SUBSTRATE
121 BASE MATERIAL
122 COLOR FILTER
123 PROTECTIVE FILM
131 UPPER ELECTRODE
132 INSULATING SECTION
133 LIGHT EMITTING UNIT
134 LOWER ELECTRODE
135 PLANARIZATION FILM
136 CONTACT PLUG
137 FIRST CONNECTION PART
220 UPPER SUBSTRATE
224 SEALING RESIN
229 BASE MATERIAL
320 UPPER SUBSTRATE
331 UPPER ELECTRODE
332 INSULATING SECTION
336 CONTACT PLUG
337 FIRST CONNECTION PART
420 UPPER SUBSTRATE
430 SEMI-TRANSMISSIVE REFLECTION FILM
431 UPPER ELECTRODE
520 UPPER SUBSTRATE
538 INSULATING FILM
620 UPPER SUBSTRATE
624 LENS LAYER
625 CONDENSING LENS
626 TRANSPARENT MATERIAL
720 UPPER SUBSTRATE
731 UPPER ELECTRODE
732 INSULATING FILM
733 LIGHT EMITTING UNIT
734 LOWER ELECTRODE
811 CAMERA BODY UNIT
812 IMAGING LENS UNIT
813 GRIP PART
814 MONITOR
815 VIEWFINDER
911 DISPLAY UNIT SHAPED LIKE GLASSES
912 EAR-HOOK SECTION
930 GLASSES (EYEWEAR)
941 SEE-THROUGH HEAD MOUNTED DISPLAY
942 BODY PART
943 ARM
944 LENS BARREL

The invention claimed is:
1. A display device comprising:
pixels arranged in a two-dimensional matrix, each of the pixels including a light emitting element formed by stacking an upper electrode, a light emitting unit, and a lower electrode, wherein
the light emitting elements are formed by forming the upper electrodes which are light-transmissive, and then sequentially stacking, onto the upper electrodes, the light emitting units and the lower electrode which is formed from a metal material,
the light emitting units are formed from an organic layer including a light emitting layer or are formed from a micrometer-sized LED element,
a joining surface of a lower substrate in which a drive circuit that drives the light emitting elements is formed is joined to a joining surface that an upper substrate in which the light emitting elements are formed has on a lower-electrode side,
the upper substrate includes first connection parts disposed on the joining surface on the lower-electrode side so as to correspond to the respective light emitting elements,
the lower substrate includes second connection parts disposed on the joining surface of the lower substrate so as to correspond to the first connection parts,
the upper electrodes are formed individually to correspond to the respective light emitting elements,
the lower electrode is formed as an electrode shared by each of the light emitting elements, and
the upper electrodes and the first connection parts are connected via contact plugs passing through openings provided in the lower electrode.

2. The display device according to claim 1, wherein the light emitting elements are electrically connected to the drive circuit that drives the light emitting elements, by joining the first connection parts to the second connection parts.

3. The display device according to claim 1, wherein the contact plugs are formed to be connected to bottom surfaces or side surfaces of the upper electrodes.

4. The display device according to claim 1, wherein the organic layers are each formed such that a hole injection layer is located on an upper-electrode side and an electron injection layer is located on the lower-electrode side.

5. The display device according to claim 1, wherein
the upper electrode is formed as an electrode shared by each of the light emitting elements, and
the lower electrodes are formed individually to correspond to the respective light emitting elements.

6. The display device according to claim 5, wherein the lower electrodes and the first connection parts are connected via contact plugs.

7. The display device according to claim 5, wherein the organic layers are each formed such that a hole injection layer is located on the lower-electrode side and an electron injection layer is located on an upper-electrode side.

8. The display device according to claim 1, wherein the organic layer of each of the light emitting elements is formed to emit white light.

9. The display device according to claim 1, wherein the organic layer of each of the light emitting elements is formed to emit red light, green light, or blue light.

10. The display device according to claim 1, wherein the light emitting elements include a resonator structure that resonates light generated by the light emitting units.

11. The display device according to claim 1, wherein condensing lenses provided to correspond to the respective light emitting elements are formed in the upper substrate.

12. An electronic instrument comprising a display device according to claim 1.

13. The electronic instrument according to claim 12, wherein the light emitting elements are electrically connected to the drive circuit that drives the light emitting elements, by joining the first connection parts to the second connection parts.

14. The electronic instrument according to claim 12, wherein the contact plugs are formed to be connected to bottom surfaces or side surfaces of the upper electrodes.

15. The electronic instrument according to claim 12, wherein the organic layers are each formed such that a hole injection layer is located on an upper-electrode side and an electron injection layer is located on the lower-electrode side.

16. The electronic instrument according to claim 12, wherein
the upper electrode is formed as an electrode shared by each of the light emitting elements, and
the lower electrodes are formed individually to correspond to the respective light emitting elements.

17. The electronic instrument according to claim 16, wherein the lower electrodes and the first connection parts are connected via contact plugs.

18. The electronic instrument according to claim 16, wherein the organic layers are each formed such that a hole injection layer is located on the lower-electrode side and an electron injection layer is located on an upper-electrode side.

19. The electronic instrument according to claim 12, wherein the organic layer of each of the light emitting elements is formed to emit white light.

20. A method for fabricating a display device in which pixels each including a light emitting element formed by stacking an upper electrode, a light emitting unit, and a lower electrode are arranged in a two-dimensional matrix, the method comprising:
forming the light emitting elements by forming, on a base material, the upper electrodes which are light-transmissive, and then sequentially stacking, onto the upper electrodes, the light emitting units and the lower electrode which is formed from a metal material, wherein
the light emitting units are formed from an organic layer including a light emitting layer or are formed from a micrometer-sized LED element; and
forming a joining surface of a lower substrate in which a drive circuit that drives the light emitting elements is formed is joined to a joining surface that an upper substrate in which the light emitting elements are formed has on a lower-electrode side, wherein
the upper substrate includes first connection parts disposed on the joining surface on the lower-electrode side so as to correspond to the respective light emitting elements,
the lower substrate includes second connection parts disposed on the joining surface of the lower substrate so as to correspond to the first connection parts,
the upper electrodes are formed individually to correspond to the respective light emitting elements,
the lower electrode is formed as an electrode shared by each of the light emitting elements, and
the upper electrodes and the first connection parts are connected via contact plugs passing through openings provided in the lower electrode.

* * * * *